United States Patent
Liu et al.

(10) Patent No.: US 12,507,466 B2
(45) Date of Patent: Dec. 23, 2025

(54) MULTI-GATE TRANSISTOR DEVICE INCLUDING A PLURALITY OF GATE LINES WITH BRIDGE PORTION AND METHOD FOR FABRICATING THE SAME

(71) Applicant: TAIWAN SEMICONDUCTOR MANUFACTURING COMPANY, LTD., Hsinchu (TW)

(72) Inventors: Chia-Chu Liu, Hsinchu (TW); Chia-He Lin, Hsinchu County (TW); Wen-Yun Wang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 636 days.

(21) Appl. No.: 17/894,097

(22) Filed: Aug. 23, 2022

(65) Prior Publication Data

US 2024/0071830 A1 Feb. 29, 2024

(51) Int. Cl.
*H10D 84/03* (2025.01)
*H10D 30/67* (2025.01)
*H10D 62/10* (2025.01)
*H10D 84/01* (2025.01)

(52) U.S. Cl.
CPC ....... *H10D 84/038* (2025.01); *H10D 30/6735* (2025.01); *H10D 62/121* (2025.01); *H10D 84/0151* (2025.01)

(58) Field of Classification Search
CPC ............. H10D 30/6735; H10D 84/038; H10D 84/0151; H10D 30/797
See application file for complete search history.

(56) References Cited

U.S. PATENT DOCUMENTS

| | | | | |
|---|---|---|---|---|
| 2011/0108890 A1* | 5/2011 | Becker | ................. | H01L 23/5226 257/211 |
| 2013/0140707 A1* | 6/2013 | Misaka | ................. | H01L 23/528 257/773 |
| 2020/0343364 A1* | 10/2020 | Kim | ...................... | H10D 89/10 |

* cited by examiner

*Primary Examiner* — Changhyun Yi
(74) *Attorney, Agent, or Firm* — Maschoff Brennan

(57) ABSTRACT

A semiconductor device includes a semiconductor substrate, an isolation feature, gate lines, and a first gate structure. The isolation feature is over the semiconductor substrate and surrounding an active region of the semiconductor substrate. The gate lines extend across the active region of the semiconductor substrate. The first gate structure is over the isolation feature. The first gate structure includes a first gate line, a second gate line, and a first bridge portion, the first and second gate lines are substantially parallel with the gate lines, and the first bridge portion connects the first gate line to the second gate line.

20 Claims, 34 Drawing Sheets

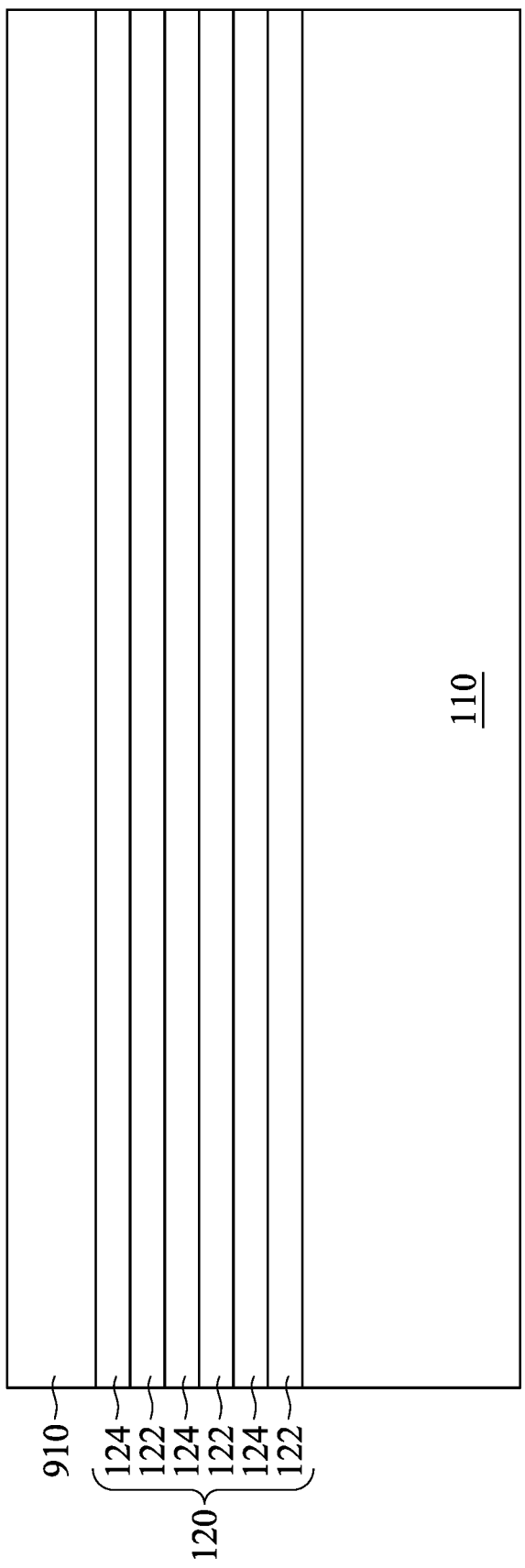

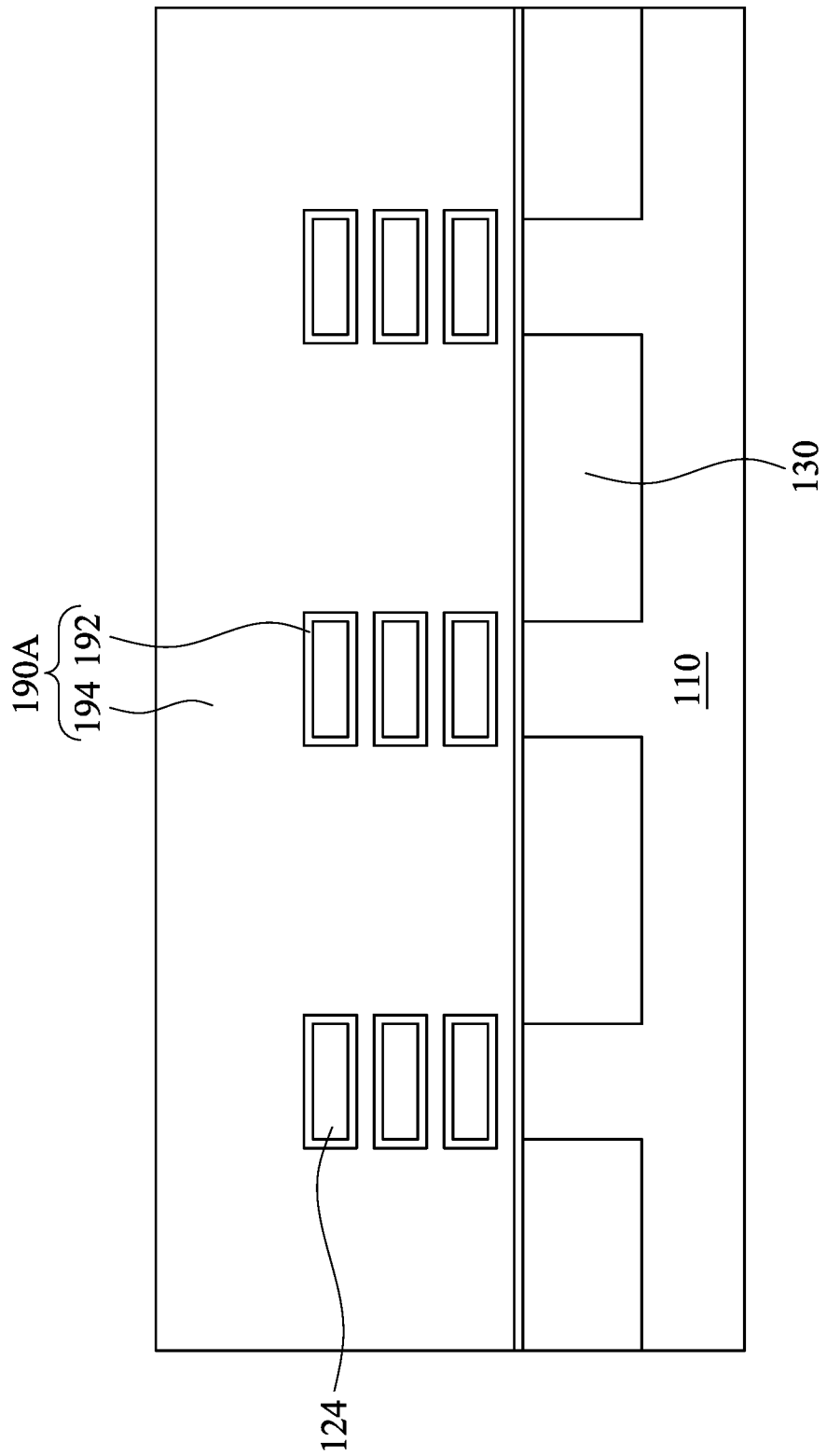

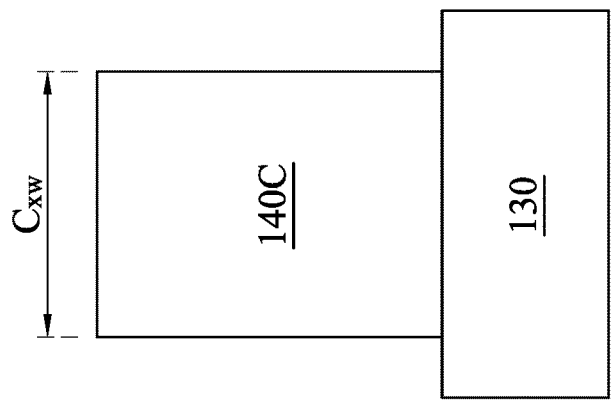
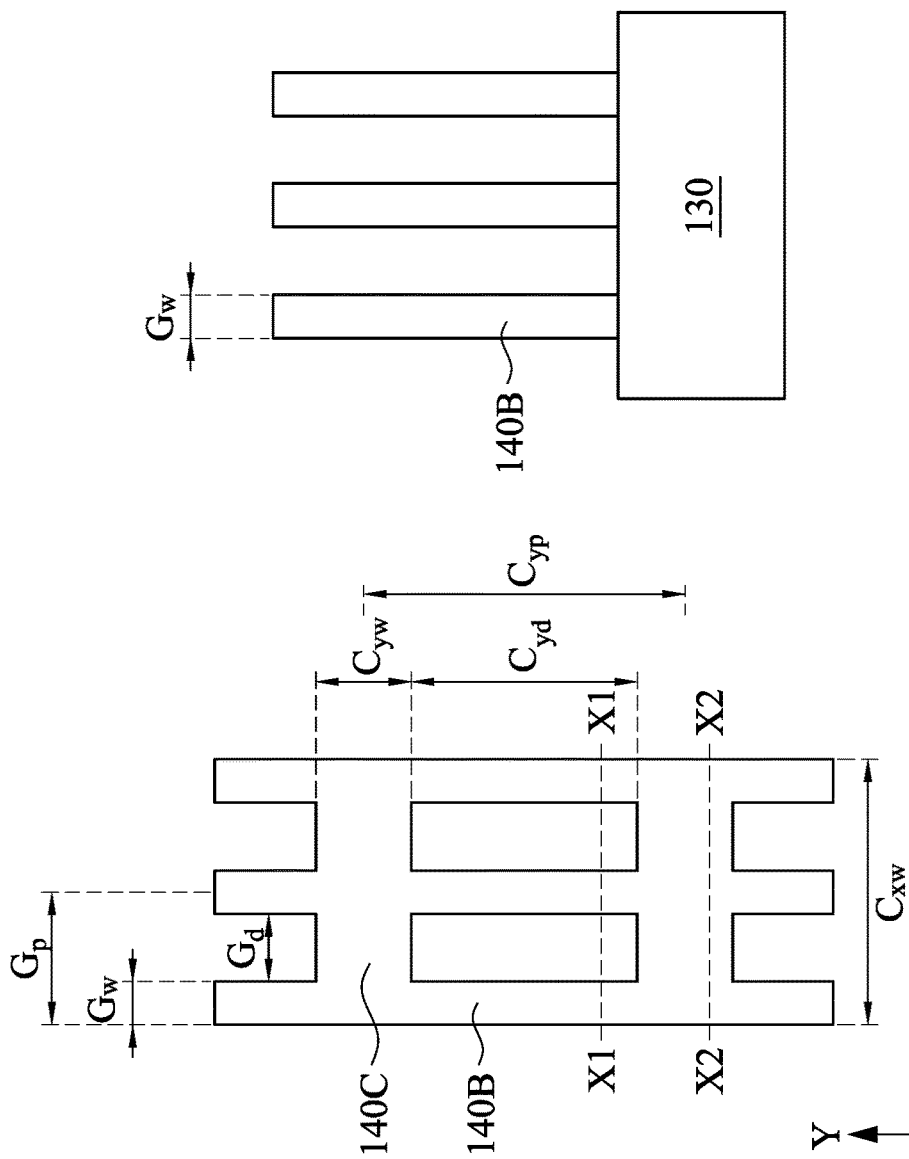
Fig. 12C
Fig. 12B
Fig. 12A

MULTI-GATE TRANSISTOR DEVICE INCLUDING A PLURALITY OF GATE LINES WITH BRIDGE PORTION AND METHOD FOR FABRICATING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2A, 2B, 3A, 3B, 4A, 4B, 4C, 5A, 5B, 5C, 5D, 5E, 6A, 6B, 7A, 7B, 7C, 8A, 8B, 8C, 8D, 8E, 9A, 9B, 9C, 9D, 9E, 10, 11A, 11B, 11C, and 11D illustrate various stages of fabricating a semiconductor device according to some embodiments of the present disclosure.

FIG. 12A is a schematic top view of a semiconductor device in accordance with some embodiments of the present disclosure.

FIG. 12B is a cross-sectional view taken along line X1-X1 in FIG. 12A.

FIG. 12C is a cross-sectional view taken along line X2-X2 in FIG. 12A.

DETAILED DESCRIPTION

Figure 2A:
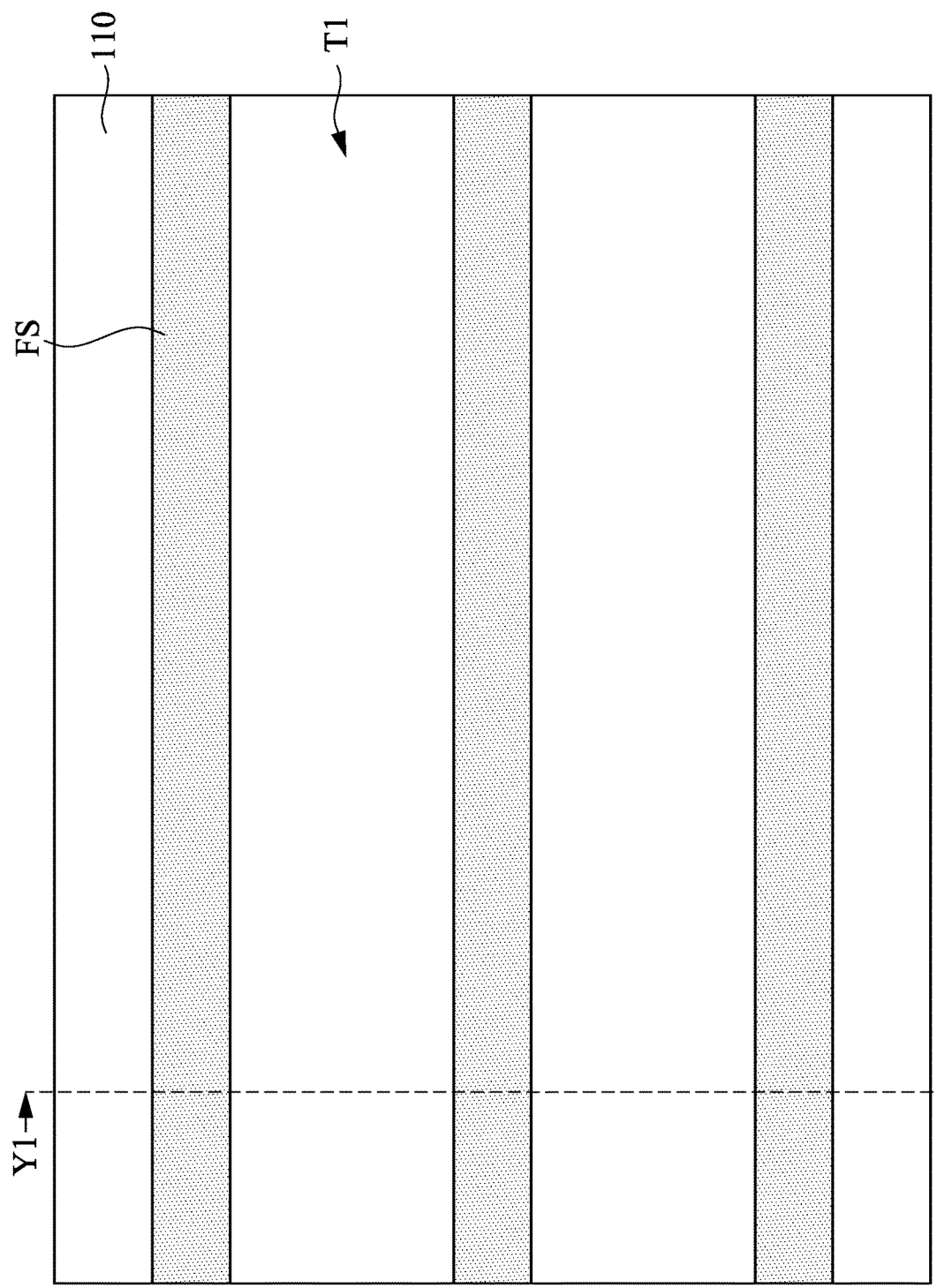

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Structures of the GAA device or the nanosheet device may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1, 2A, 2B, 3A, 3B, 4A, 4B, 4C, 5A, 5B, 50, 5D, 5E, 6A, 6B, 7A, 7B, 7C, 8A, 8B, 8C, 8D, 8E, 9A, 9B, 9C, 9D, 9E, 10, 11A, 11B, 11C, and 11D illustrate various stages of fabricating a semiconductor device according to some embodiments of the present disclosure. It is understood that additional operations may be provided before, during, and after the operations shown by FIGS. 1, 2A, 2B, 3A, 3B, 4A, 4B, 4C, 5A, 5B, 5C, 5D, 5E, 6A, 6B, 7A, 7B, 7C, 8A, 8B, 8C, 8D, 8E, 9A, 9B, 9C, 9D, 9E, 10, 11A, 11B, 11C, and 11D, and some of the operations described below can be replaced or eliminated for additional embodiments of the method. The order of the operations/processes may be interchangeable.

FIGS. 2A, 3A, 4A, 5A, 8A, 9A, 10, and 11A are top views of intermediate stages in the fabricating a semiconductor device in accordance with some embodiments of the present disclosure. FIGS. 2B, 4C, 5D, 8D, 9D, are cross-sectional views of intermediate stages of fabricating the semiconductor device along a cut Y1-Y1 (referring to FIGS. 2A, 4A, 5A, 8A, 9A). FIGS. 3B, 4B, 5B, 6A, 7A, 8B, 9B, and 11B are cross-sectional views of intermediate stages of fabricating the semiconductor device along a cut X1-X1 (referring to FIGS. 3A, 4A, 5A, 8A, 9A, and 11A). FIGS. 5C, 6B, 7B, 80, 9C, and 11C are cross-sectional views of intermediate stages of fabricating the semiconductor device along a cut X2-X2 (referring to FIGS. 5A, 8A, 9A, and 11A). FIGS. 5E, 7C, 8E, 9E, and 11D are cross-sectional views of intermediate stages of fabricating the semiconductor device along a cut Y2-Y2 (referring to FIGS. 5A, 8A, 9A, and 11A).

As with the other method embodiments and exemplary devices discussed herein, it is understood that parts of the semiconductor device may be fabricated by a CMOS technology process flow, and thus some processes are only briefly described herein. Further, the exemplary semiconductor device may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the concepts of the present disclosure. In some embodiments, the exemplary semiconductor device includes a plurality of semiconductor devices (e.g., transistors), including PFETs, NFETs, etc., which may be interconnected.

Referring to FIG. 1, an epitaxial stack 120 is formed over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, selective epitaxial growth (SEG), or another appropriate method.

The epitaxial stack 120 includes epitaxial layers 122 of a first composition interposed by epitaxial layers 124 of a second composition. The first and second compositions can be different. In some embodiments, the epitaxial layers 122 are SiGe and the epitaxial layers 124 are silicon (Si). However, other embodiments are possible including those that provide for a first composition and a second composition having different oxidation rates and/or etch selectivity. In some embodiments, the epitaxial layers 122 include SiGe and where the epitaxial layers 124 include Si, the Si oxidation rate of the epitaxial layers 124 is less than the SiGe oxidation rate of the epitaxial layers 122.

The epitaxial layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 124 to define a channel or channels of a device is further discussed below. It is noted that three layers of the epitaxial layers 122 and three layers of the epitaxial layers 124 are alternately arranged as illustrated in FIG. 1, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of epitaxial layers 124 is between 2 and 10.

The epitaxial layers 122 in channel regions(s) may eventually be removed and serve to define a vertical distance between adjacent channel region(s) for a subsequently-formed multi-gate device. Accordingly, the epitaxial layers 122 may also be referred to as sacrificial layers, and epitaxial layers 124 may also be referred to as channel layers.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 324 include the same material as the substrate 110. In some embodiments, the epitaxially grown layers 122 and 124 include a different material than the substrate 110. As stated above, in at least some examples, the epitaxial layers 122 include an epitaxially grown silicon germanium (SiGe) layer and the epitaxial layers 124 include an epitaxially grown silicon (Si) layer. Alternatively, in some embodiments, either of the epitaxial layers 122 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 122 and 124 may be chosen based on providing differing oxidation and/or etching selectivity properties. In some embodiments, the epitaxial layers 122 and 124 are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

Figure 2B:
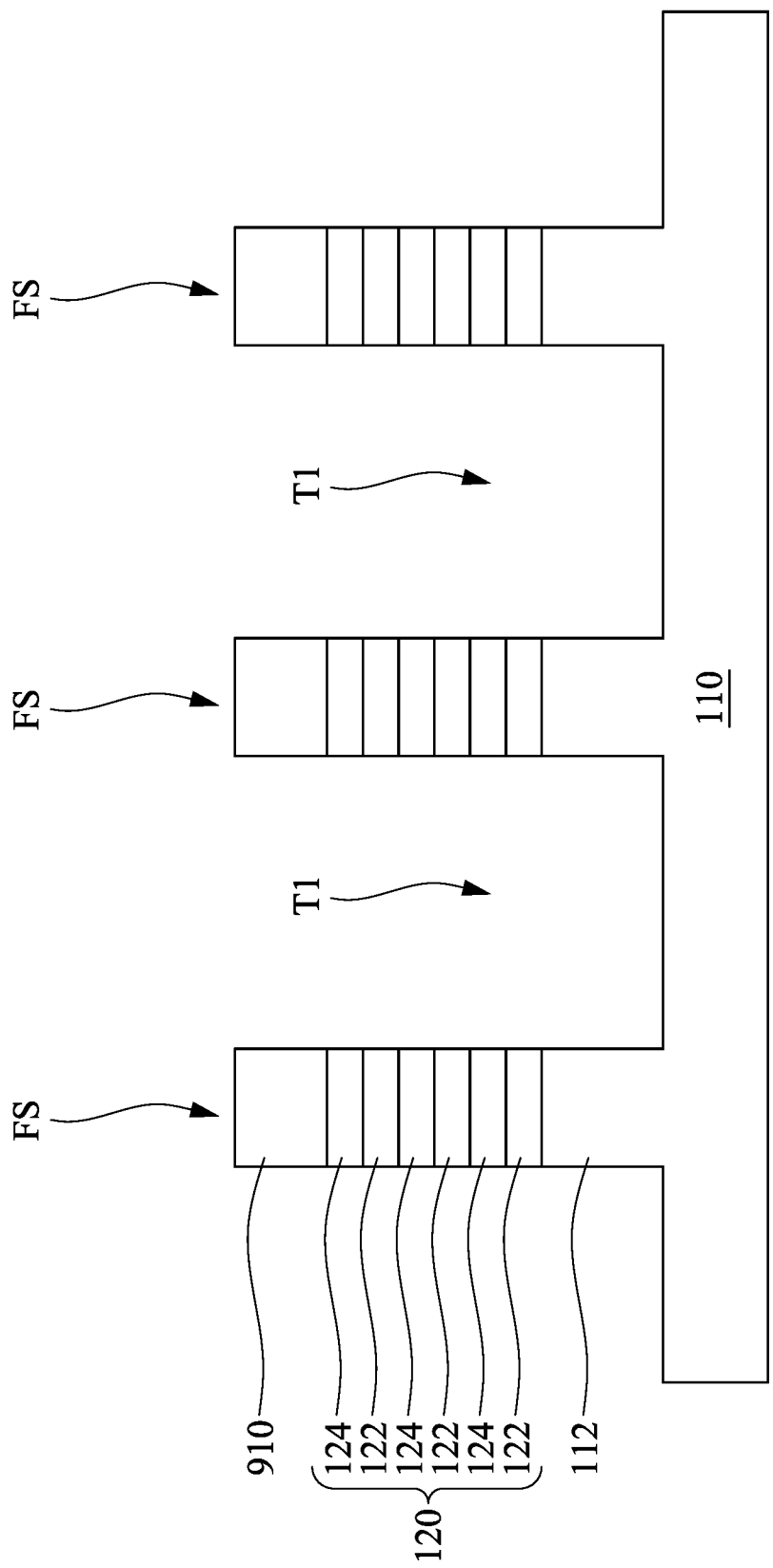

Reference is made to FIGS. 2A and 2B. A plurality of semiconductor fins FS extending from the substrate 110 are formed. In various embodiments, each of the fins FS includes a substrate portion 112 formed from the substrate 110 and portions of each of the epitaxial layers of the epitaxial stack 120 including epitaxial layers 122 and 124. The fins FS may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins FS by etching initial epitaxial stack 120. The etching process can include dry etching, wet etching, reactive ion etching (RIE), and/or other suitable processes.

As illustrated in FIGS. 1 and 2B, a hard mask (HM) layer 910 is formed over the epitaxial stack 120 prior to patterning the fins FS. In some embodiments, the HM layer 910 includes an oxide layer (e.g., a pad oxide layer that may include $SiO_2$) and a nitride layer (e.g., a pad nitride layer that may include $Si_3N_4$) formed over the oxide layer. The oxide layer may act as an adhesion layer between the epitaxial stack 120 and the nitride layer and may act as an etch stop layer for etching the nitride layer. In some examples, the HM oxide layer includes thermally grown oxide, chemical vapor deposition (CVD)-deposited oxide, and/or atomic layer deposition (ALD)-deposited oxide. In some embodiments, the HM nitride layer is deposited on the HM oxide layer by CVD and/or other suitable techniques.

The fins FS may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-100 nm. The patterned mask may then be used to protect regions of the substrate 110, and layers formed thereupon, while an etch process forms trenches T1 in unprotected regions through the HM layer 910, through the epitaxial stack 120, and into the substrate 110, thereby leaving the plurality of extending fins FS. The trenches T1 may be etched using a dry etch (e.g., reactive ion etching), a wet etch, and/or combination thereof. The photoresist layer may be removed by suitable stripping process after the etching processes.

Figure 3A:
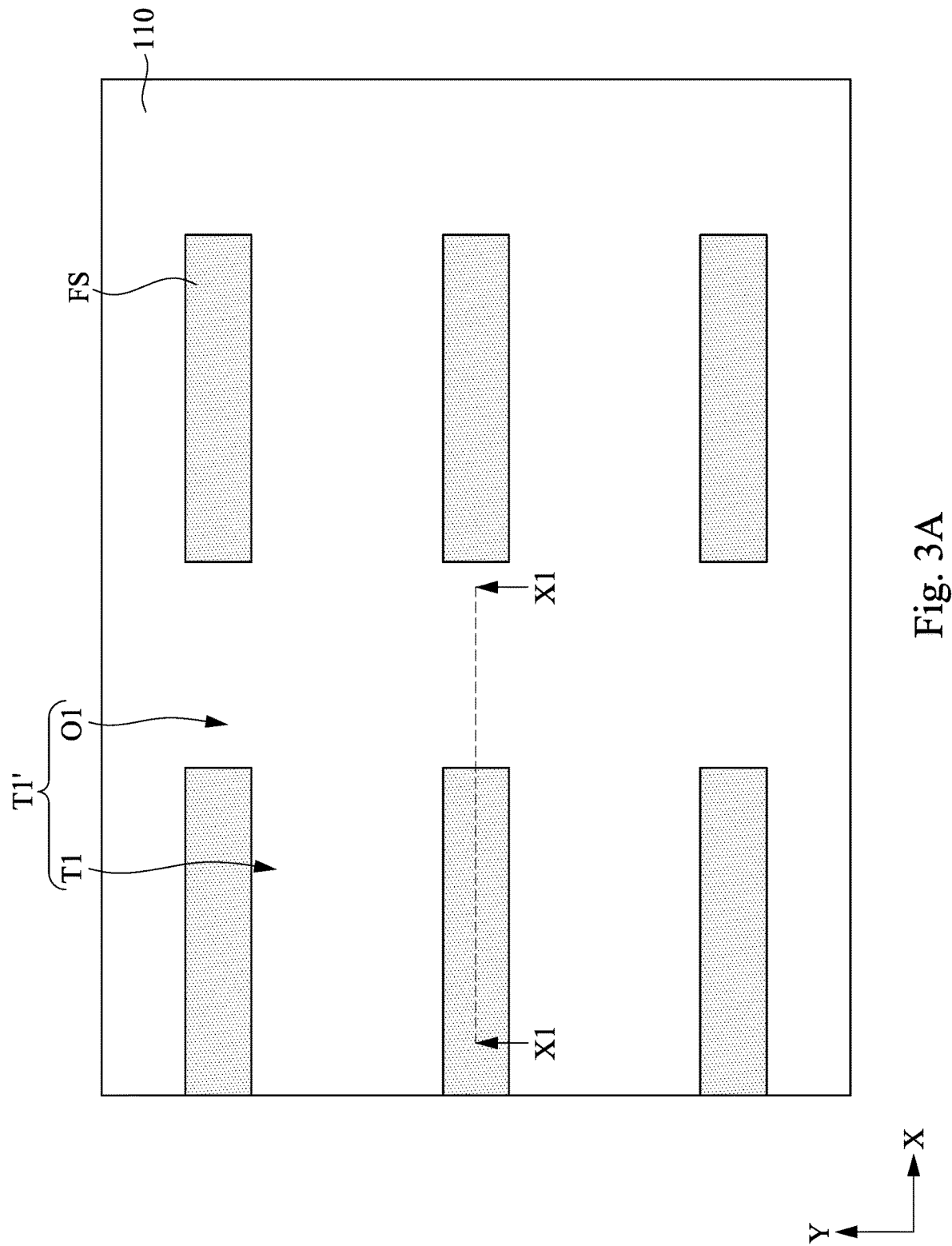
Figure 3B:
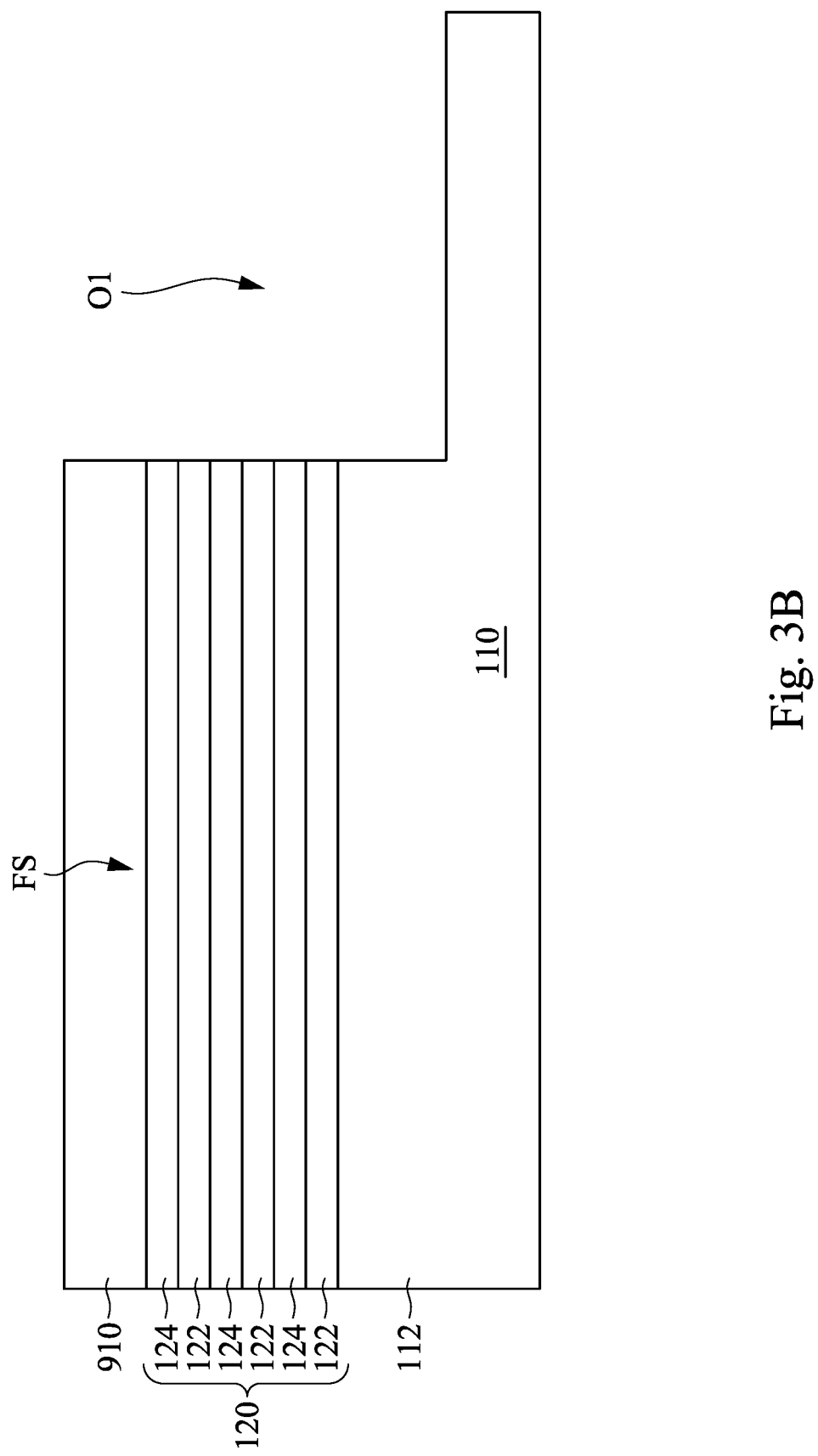

Reference is made to FIGS. 3A and 3B. At least one of the fins FS is cut into plural separated fins FS. The cutting process may be performed using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-100 nm. The patterned mask may then be used to protect regions of the substrate 110, and layers formed thereupon, while an etch process forms openings O1 in unprotected regions through the HM layer 910, through the epitaxial stack 120, and into the substrate 110, thereby leaving the plurality of extending fins FS. The openings O1 may be etched using a dry etch (e.g., reactive ion etching), a wet etch, and/or combination thereof. The openings O1 and trenches T1 in combination may be referred to as a trench T1'. The photoresist layer may be removed by suitable stripping process after the etching processes. Numerous other embodiments of methods to form the fins on the substrate may also be used including, for example, defining the fin region (e.g., by mask or isolation regions) and epitaxially growing the epitaxial stack 120 in the form of the fins FS.

Figure 4A:
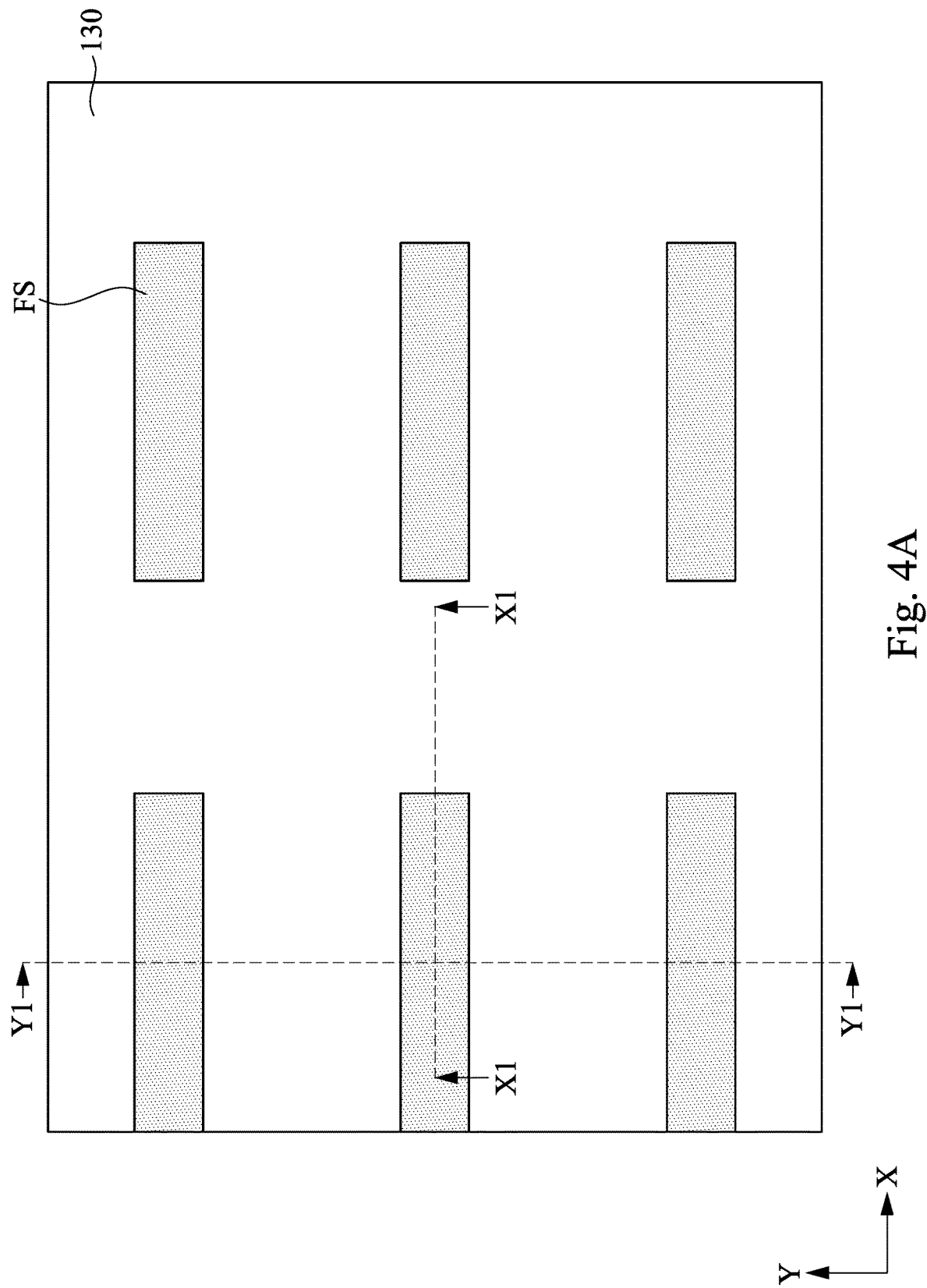
Figure 4B:
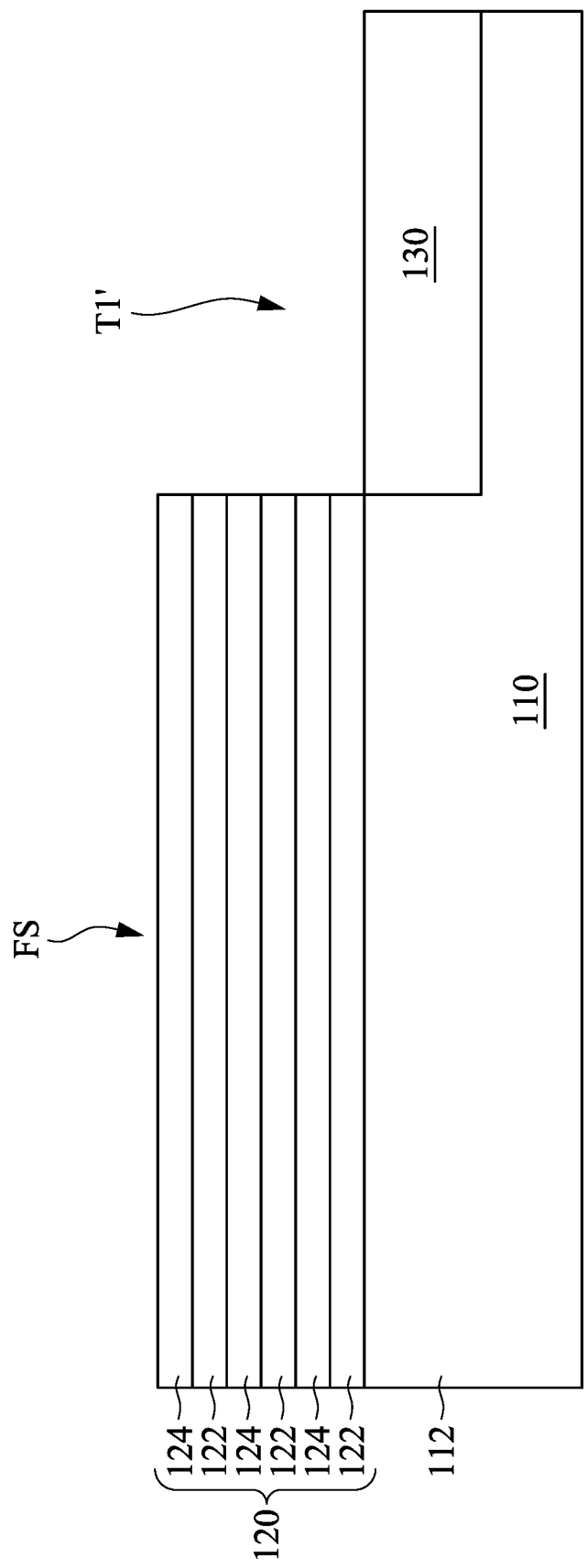
Figure 4C:
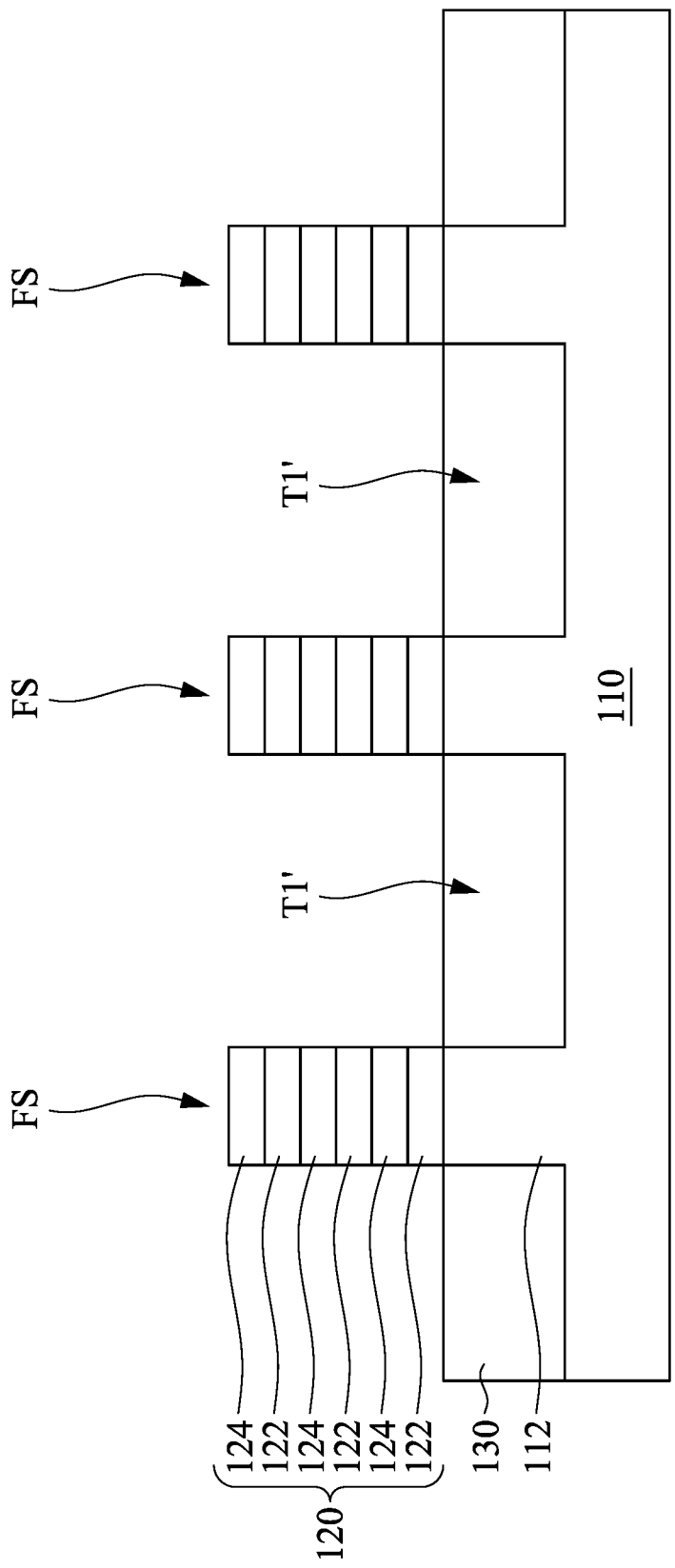

Reference is made to FIGS. 4A, 4B, and 4C. Shallow trench isolation (STI) features 130 are formed over the substrate 110 and define active regions. In the present embodiments for forming GAA transistor, the isolation features 130 are interposing the fins FS, and the active regions by the isolation features 130 are fins FS having the epitaxial stack 120. In some alternative embodiments for forming Fin Field-Effect Transistor (FinFet), the active regions defined by the isolation (STI) features 130 may be fins FS including a single semiconductor material. In some other embodiments for forming planar devices, the active regions defined by the isolation (STI) features 130 may be regions of the substrate 110 not protruding from a top surface of the substrate 110.

By way of example and not limitation, a dielectric layer is first deposited over the substrate 110, filling the trenches T1' with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, the dielectric layer (and subsequently formed STI features 130) may include a multi-layer structure, for example, having one or more liner layers.

In some embodiments of forming the isolation (STI) features 130, after deposition of the dielectric layer, the deposited dielectric material is thinned and planarized, for example by a chemical mechanical polishing (CMP) process. In some embodiments, the HM layer 910 (as illustrated FIG. 3B) functions as a CMP stop layer. The STI features 130 interposing the fins FS are recessed. Referring to the example of FIGS. 4B and 4C, the STI features 130 are recessed providing the fins FS extending above the STI features 130. In some embodiments, the recessing process may include a dry etching process, a wet etching process, and/or a combination thereof. The HM layer 910 (as illustrated FIG. 3B) may also be removed before, during, and/or after the recessing of the STI features 130. The nitride layer of the HM layer 910 (as illustrated FIG. 3B) may be removed, for example, by a wet etching process using $H_3PO_4$ or other suitable etchants. In some embodiments, the oxide layer of the HM layer 910 (as illustrated FIG. 3B) is removed by the same etchant used to recess the STI features 130. In some embodiments, a recessing depth is controlled (e.g., by controlling an etching time) so as to result in a desired height of the exposed upper portion of the fins FS. In the illustrated embodiment, the desired height exposes each of the layers of the epitaxial stack 120 in the fins FS.

Reference is made to FIGS. 5A, 5B, 5C, 5D, and 5E, where gate structures 140 are formed over the substrate 110. In some embodiments, the gate structures 140 are dummy (sacrificial) gate structures that are subsequently removed. Thus, in some embodiments using a gate-last process, the gate structures 140 are dummy gate structures and will be replaced by the final gate structures at a subsequent processing stage of the semiconductor device. In particular, the dummy gate structures 140 may be replaced at a later processing stage by a high-k dielectric layer (HK) and metal gate electrode (MG) as discussed below.

The dummy gate structures 140 may include gate lines 140A and 140B extending along substantially parallel to each other, for example, substantially long a direction Y. The gate lines 140A are at least partially over the fins FS, for example, extending across the fins FS. The portion of the fins FS underlying the gate lines 140A may be referred to as the channel region. The gate lines 140A may also define a source/drain (S/D) region of the fins FS, for example, the regions of the fin FS adjacent and on opposing sides of the channel region. The gate lines 140B are entirely over the STI features 130 and not over the fins. For example, the gate lines 140B does not extend across the fins FS. The gate lines 140A and 140B may have a substantial same line width $G_w$ in a range from about 1 nanometer to about 50 nanometers. The gate lines 140A and 140B are spaced apart from each other by a substantially fixed distance $G_d$. The distance $G_d$ may be in a range from about 1 nanometer to about 100 nanometers. Stated differently, every two adjacent gate lines 140A and 140B have a center-to-center line pitch $G_p$, which is substantially equal to a sum of the line width $G_w$ and the distance $G_d$.

Figure 6A:
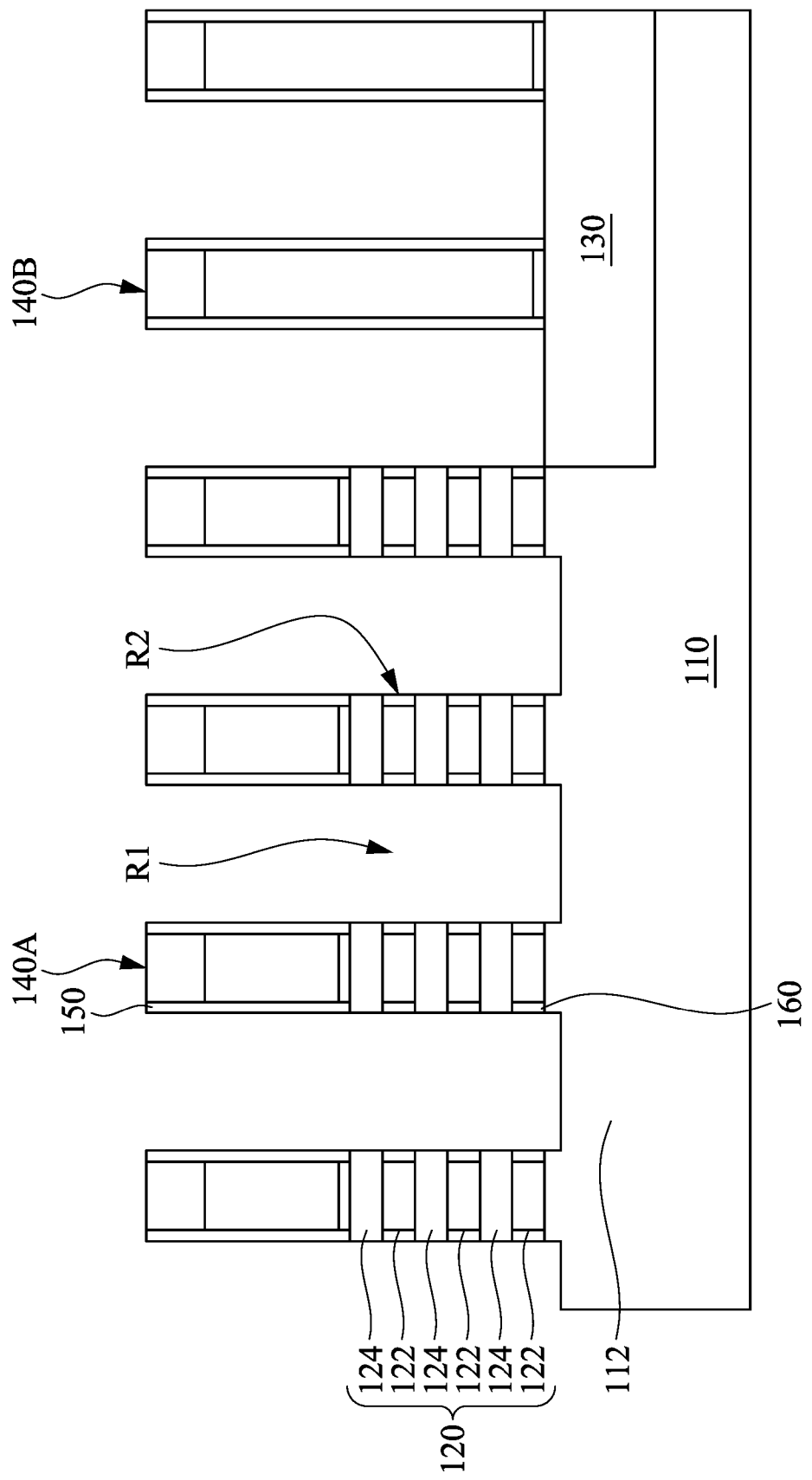
Figure 6B:
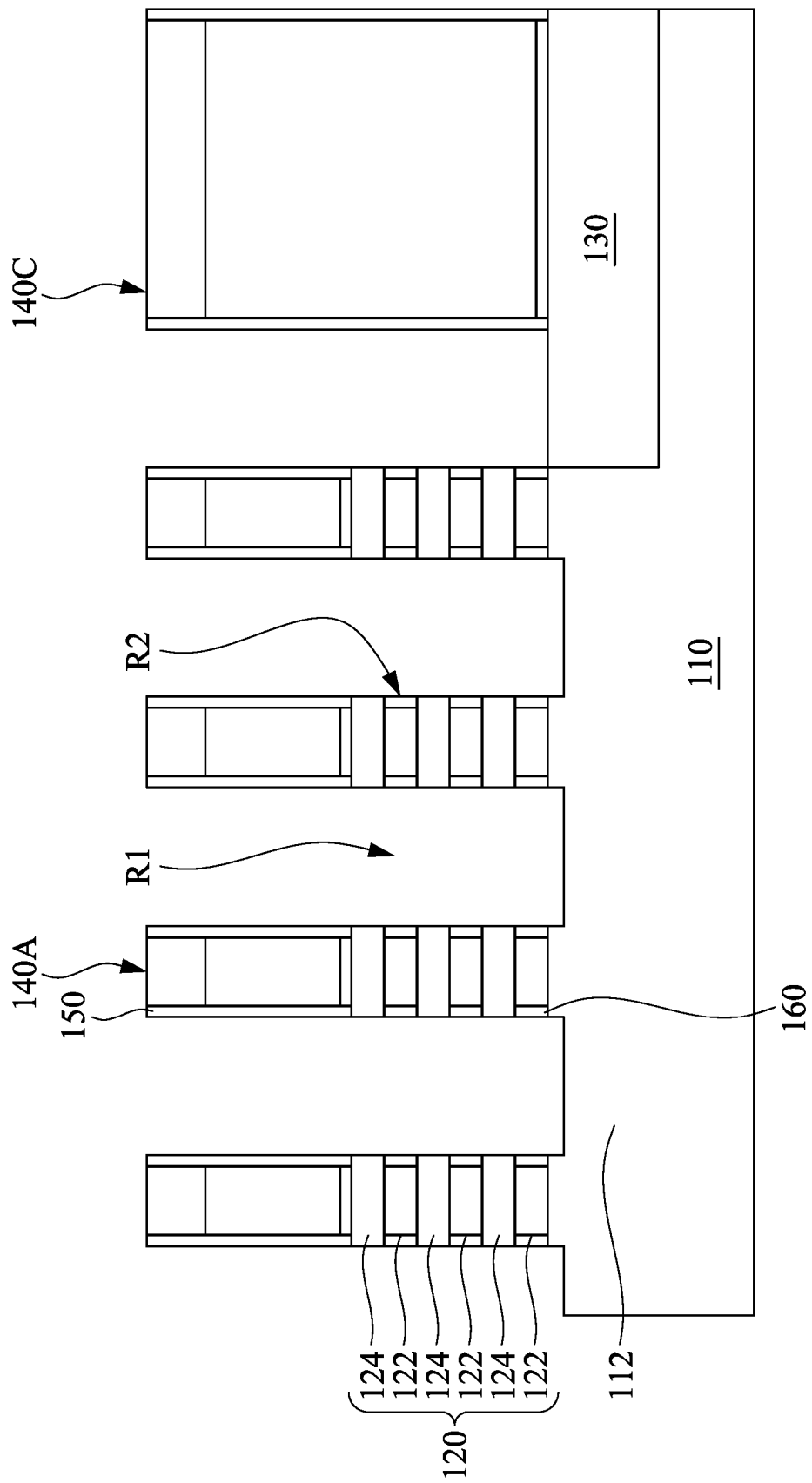

In a process of fabricating a semiconductor device, one or more wet chemical process during the fabrication process may consume oxides in the STI features 130 and provide strong surface tension force on poly lines (e.g., gate lines 140A and 140B). In some cases where the adjacent two gate lines 140B are structurally separated (or disconnected), the gate lines 140B may be unstable and collapse easily as a result of the consumed STI features 130 and the strong surface tension force on poly lines. For example, the wet chemical process may include one or more cleaning processes (e.g., using HF, diluted water, or the like). HF may react with silicon oxide, One of and yield water and H2SiF6, thereby consume oxides in the STI features 130.

the cleaning processes may be performed after a source/drain recess etching process as illustrated in FIGS. 6A and 6B later.

In some embodiments of the present disclosure, the dummy gate structures 140 include bridge portions 140C extending from a sidewall of at least one gate lines 140B and connecting the gate lines 140B to each other along a direction X perpendicular to the direction Y. The bridge portions 140C may extend through plural gate lines 140B from the top view of FIG. 5A. Through the configuration, the bridge portions 140C provide structural support between the gate lines 140B, thereby improve the stability of the poly lines and avoiding poly collapse. In some embodiments, a combination of the gate lines 140B and the bridge portions 140C, which are connected to each other, may be referred to as an inactive or non-operative gate structure. In some embodiments, the inactive or non-operative gate structures (e.g., the gate lines 140B and the bridge portions 140C) are not in contact/connection with the gate lines 140A and spaced apart from the active region of the semiconductor substrate 110 (e.g., fins FS). For example, an entirety of a bottom surface of an inactive or non-operative gate structure (e.g., the gate lines 140B and the bridge portions 140C) is in contact with the STI feature 130. In some embodiments, a center-to center-pitch between the two gate structures (e.g., the gate lines 140B and the bridge portions 140C) spaced apart by the gate lines 140A, also referred to as the pitch $C_{xp}$, is greater than 6 times the line pitch $G_w$ between the gate lines 140A and 140B.

Each of the bridge portions 140C may have a width $C_{xw}$ measured along the direction X and a width $C_{yw}$ measured along the direction X. The width $C_{xw}$ may be in a range from about one times the line pitch $G_p$ to about 7 times the line pitch $G_p$, or from about two times the line pitch $G_p$ to about 7 times the line pitch $G_p$. For example, as the figure shows, the width $C_{xw}$ of the bridge portions 140C may be substantially equal to a sum of the line width $G_w$ and the line pitch $G_p$, or approximately the line pitch $G_p$. If the width $C_{xw}$ is less than one line pitch $G_p$, the bridge portions 140C may not connecting two gate lines 140B to each other. If the width $C_{xw}$ is greater than about 7 times the line pitch $G_p$, the active areas (e.g., a length of the fins FS measured along the direction Y) may be shrunk. The width $C_{yw}$ may be in a range from about 15 nanometers to about 45 nanometers. If the width $C_{yw}$ is less than 15 nanometers, the bridge portions 140C may not provide enough mechanical support to the gate lines 140B to avoid collapse. For example, the width $C_{yw}$ may be greater than the line width $G_w$ of the gate lines 140A and 140B for provide good mechanical support. If the width $C_{yw}$ is greater than about 45 nanometers, process loading effects (e.g., CMP loading effects) on the gate lines 140A may not be well compensated by the gate lines 140B.

In some embodiments, along the direction X, two adjacent bridge portions 140C have a center-to-center pitch $C_{xp}$ therebetween. The pitch $C_{xp}$ may be in a range from about 6 times the line pitch $G_p$ to about 20 times the line pitch $G_p$. If the pitch $C_{xp}$ is less than 6 times the line pitch $G_p$, there may be no enough space for the fins FS. If the pitch $C_{xp}$ is greater than 20 times the line pitch $G_p$, the active area (e.g., a length of the fins FS measured along the direction Y) may be too large to achieve suitable device design. For example, along the direction X, two adjacent bridge portions 140C are spaced apart from each other by a distance $C_{xd}$, and the pitch $C_{xp}$ is substantially equal to a sum of the width $C_{xw}$ and the distance $C_{xd}$.

In some embodiments, along the direction Y, two adjacent bridge portions 140C have a center-to-center pitch $C_{yp}$ therebetween. The pitch $C_{yp}$ may be in a range from about 0.4 micrometers to about 5 micrometers. If the pitch $C_{yp}$ is less than about 0.4 micrometers, there may be no enough space to receive metals in later source/drain contact formation step. If the pitch $C_{yp}$ is greater than about 5 micrometers, the bridge portions 140C may not provide enough support to the gate line 140B to avoid collapse. For example, along the direction Y, two adjacent bridge portions 140C are spaced apart from each other by a distance $C_{yd}$, and the pitch $C_{yp}$ is substantially equal to a sum of the width $C_{yw}$ and the distance $C_{yd}$. The distance $C_{yd}$ may be in a range from about 300 nanometers to about 5000 nanometers. If the distance $C_{yd}$ is less than about 300 nanometers, there may be no enough space to receive metals in later source/drain contact formation step. If the pitch $C_{yp}$ is greater than about 5000 nanometers, the bridge portions 140C may not provide enough support to the gate line 140B to avoid collapse.

Figure 5A:
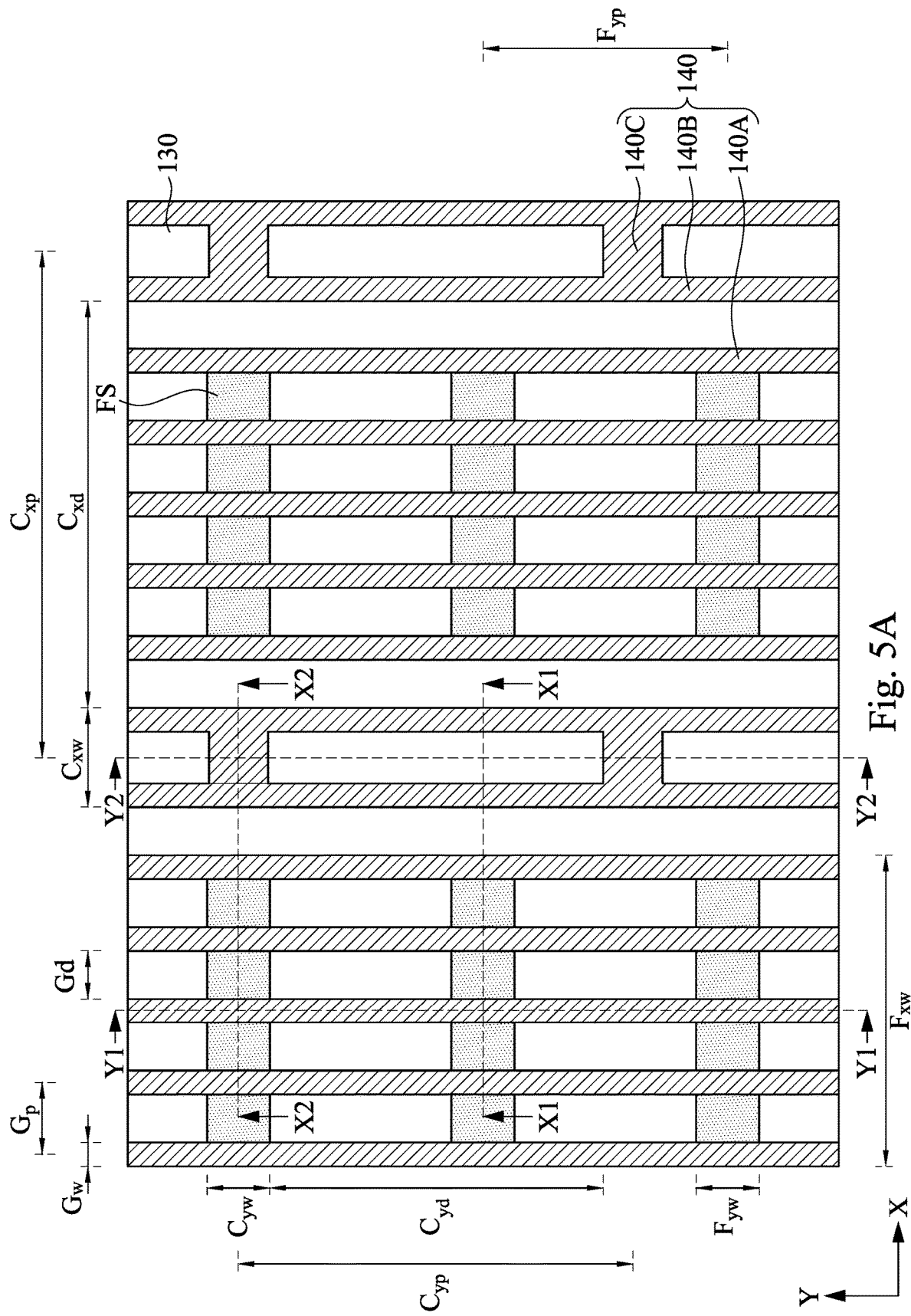
Figure 5B:
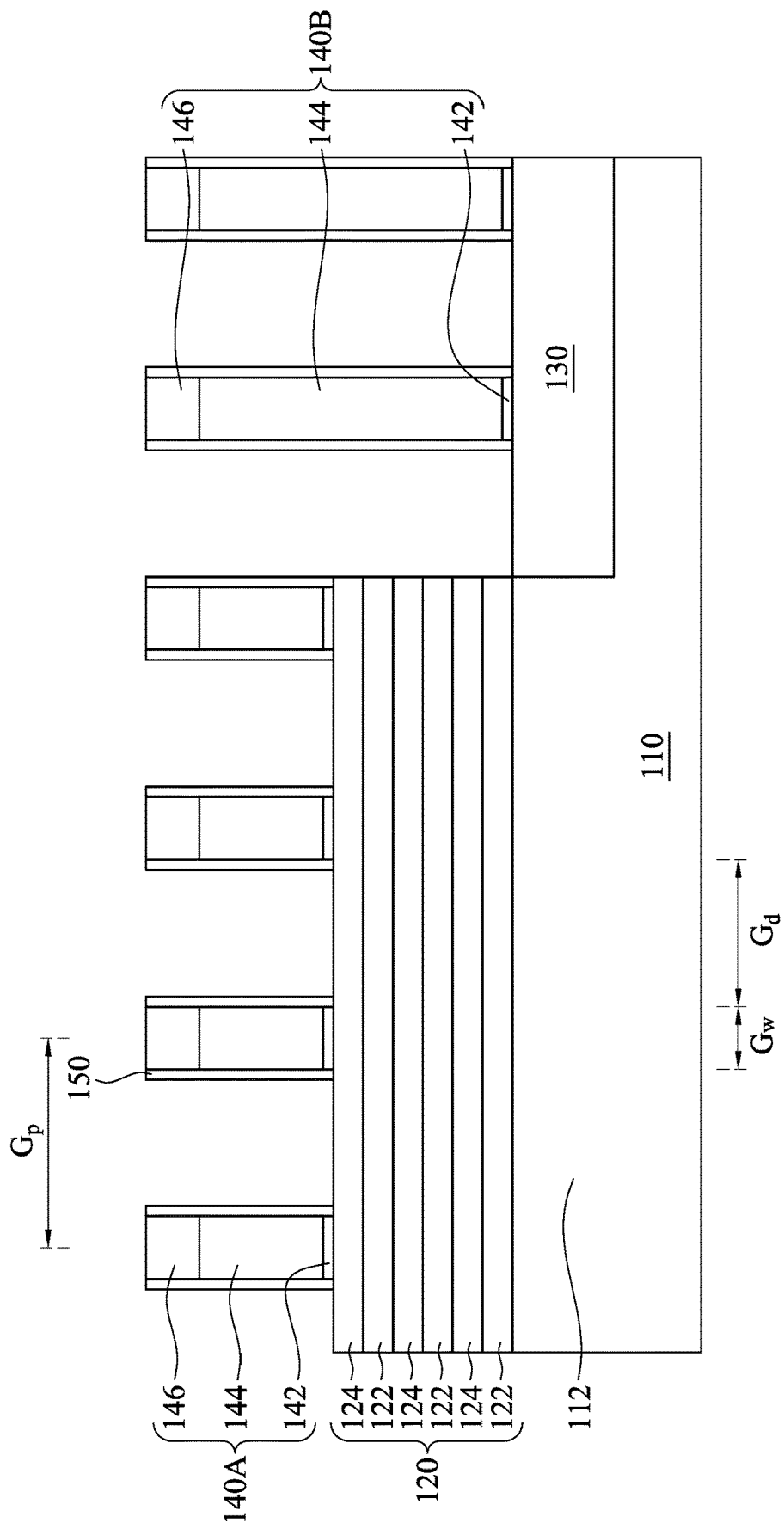
Figure 5C:
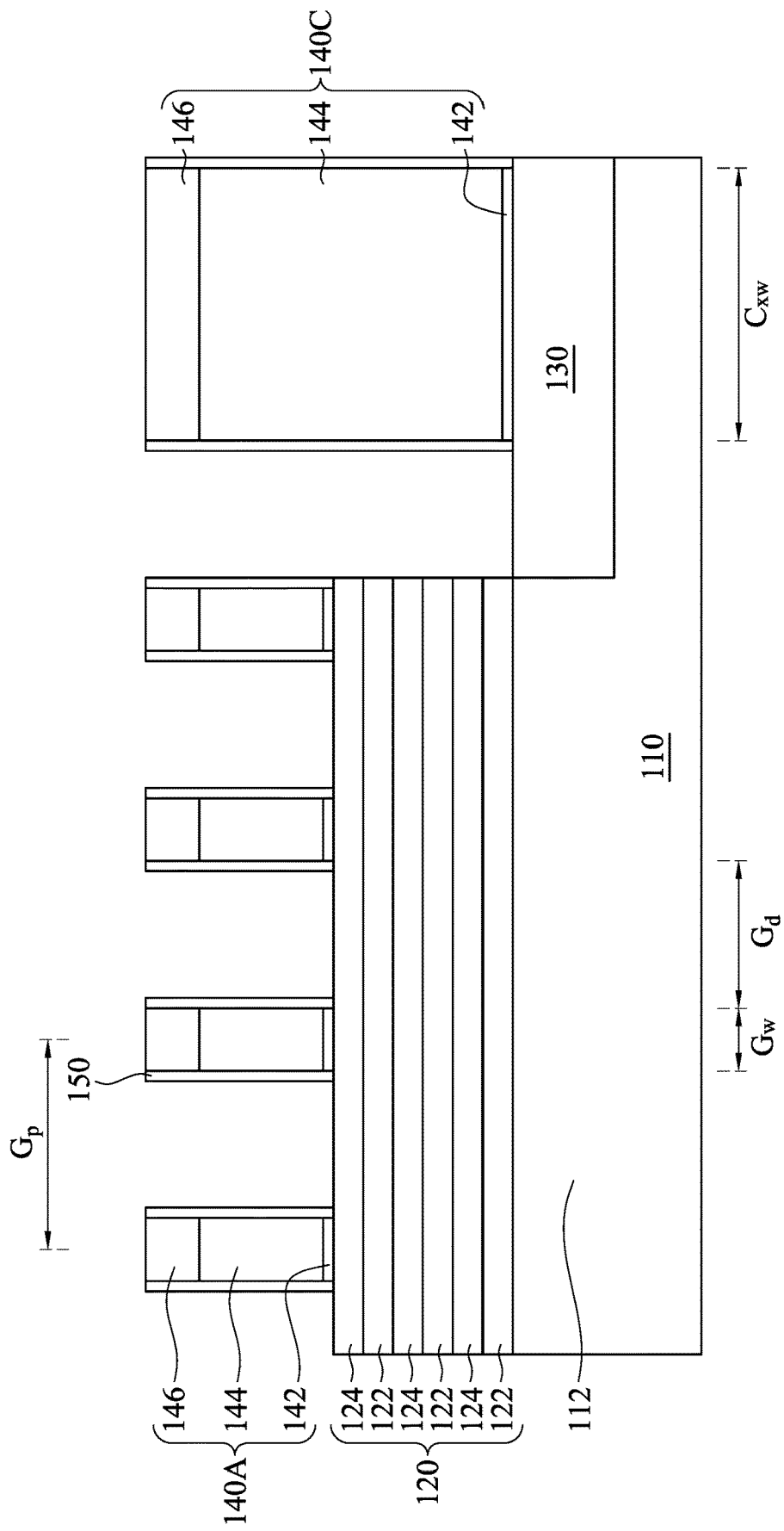
Figure 5D:
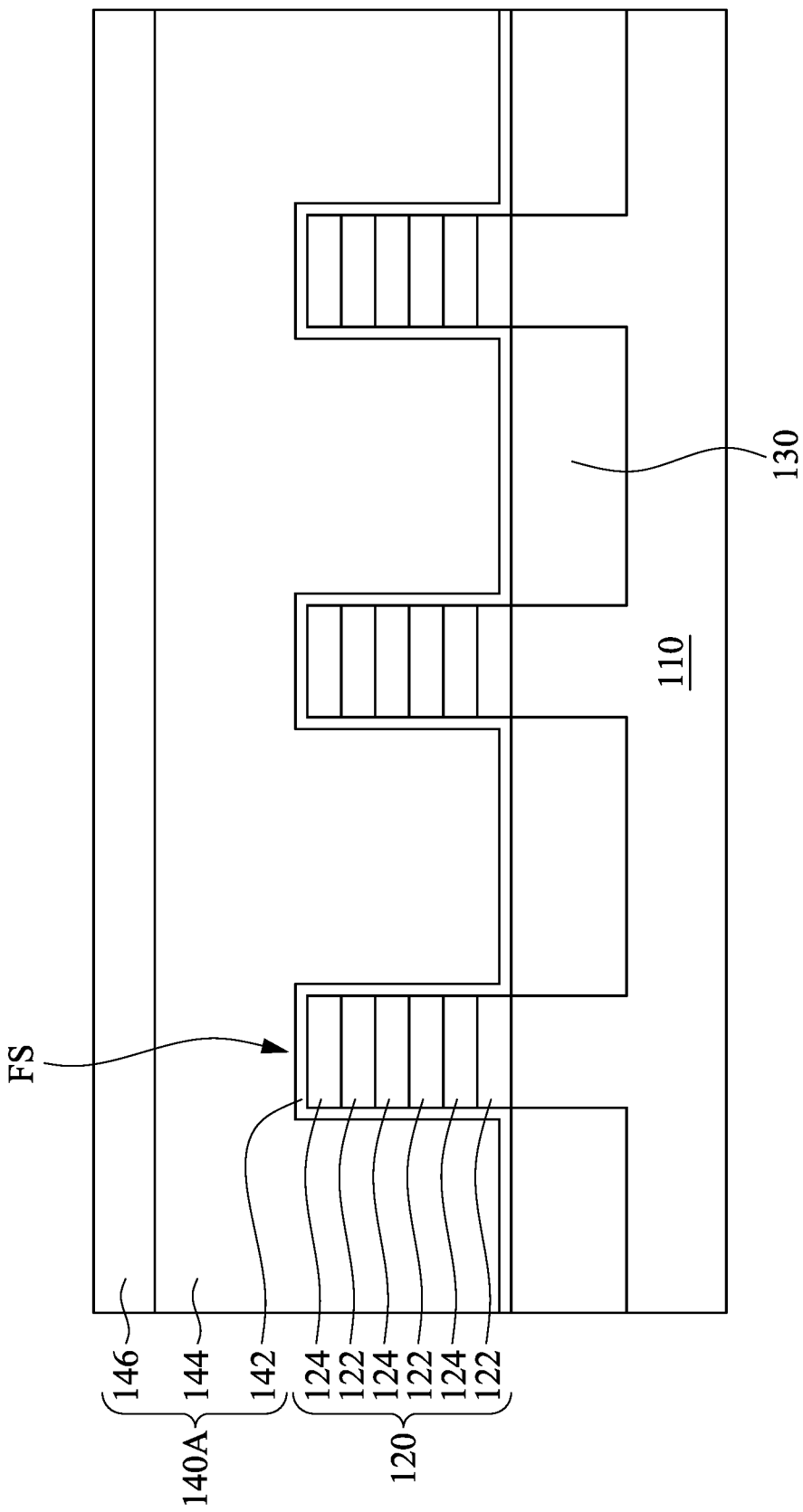
Figure 5E:
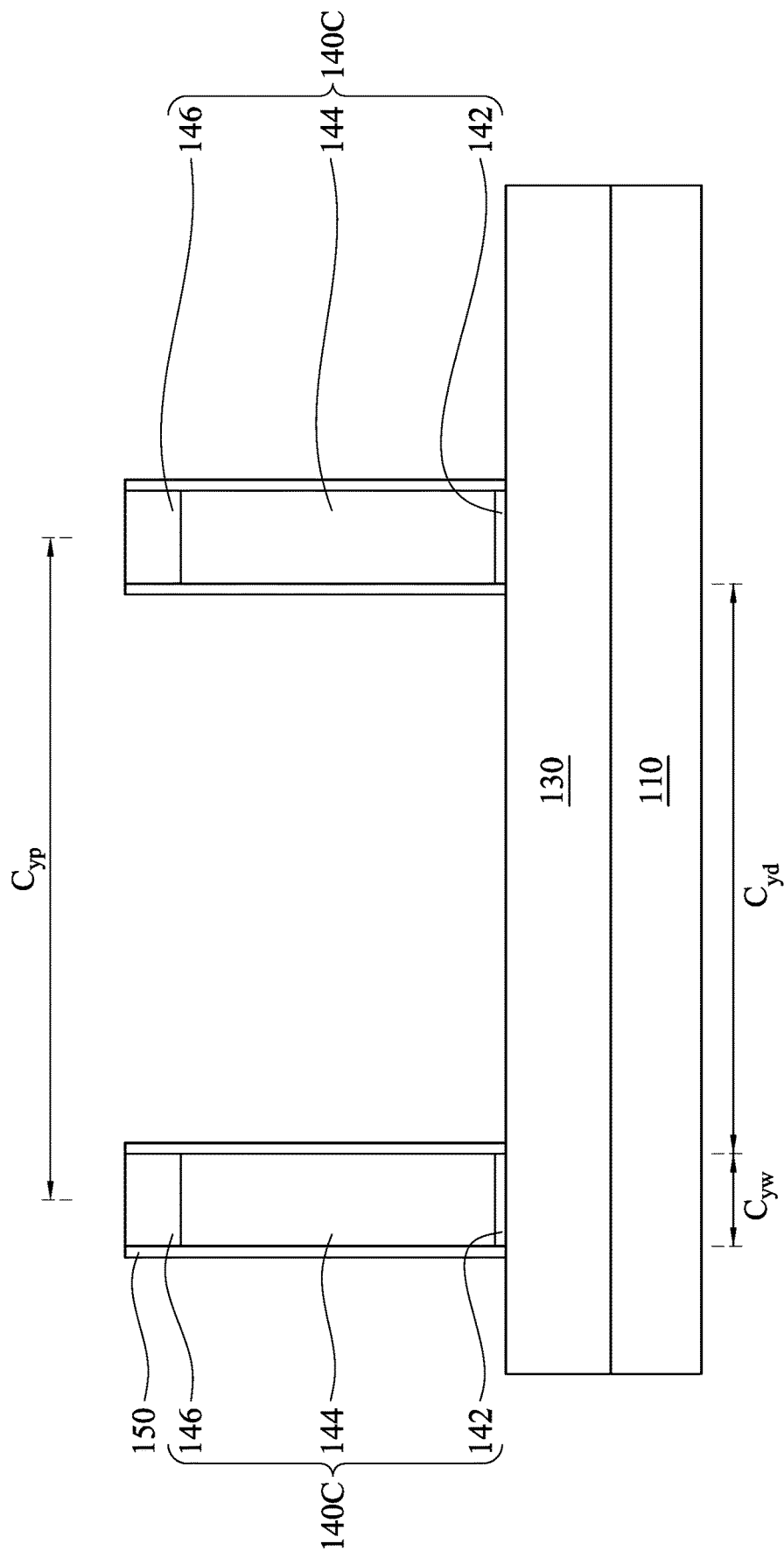

In some embodiment, the fins FS may have a length $F_{xw}$ along the direction X and a width $F_{yw}$ along the direction Y. The length $F_{xw}$ may be equal to or greater than about four times the line pitch $G_p$ for achieving suitable device design. In some embodiments, the width $C_{yw}$ of the bridge portions 140C may equal to, greater than, or less than the width $F_{yw}$ of the fins FS. The fins FS may have a vertical center-to-center pitch $F_{yp}$ therebetween, and the pitch $F_{yp}$ is less than the pitch $C_{yp}$ of the bridge portions 140C for high device density. In some embodiment, as shown in FIG. 5A, one of the bridge portions 140C is aligned with the active region of the semiconductor substrate 110 (e.g., fins FS), and another one of the bridge portions 140C is misaligned with the active region of the semiconductor substrate 110 (e.g., fins FS). In some other embodiments, the bridge portions 140C may be all aligned or all misaligned with the active region of the semiconductor substrate 110 (e.g., fins FS).

In the illustrated embodiments, the formation of the gate structures 140 first forms a dummy gate dielectric layer 142 over the fins FS. In some embodiments, the dummy gate dielectric layer 142 may include $SiO_2$, silicon nitride, a high-k dielectric material and/or other suitable material. In various examples, the dummy gate dielectric layer 142 may be deposited by a CVD process, a subatmospheric CVD (SACVD) process, a flowable CVD process, an ALD process, a PVD process, or other suitable process. By way of example, the dummy gate dielectric layer 142 may be used to prevent damages to the fins FS by subsequent processes (e.g., subsequent formation of the dummy gate structure). Subsequently, the formation of the gate structures 140 forms a dummy gate electrode layer 144 and a hard mask 146 which may include multiple layers (e.g., an oxide layer and a nitride layer). In some embodiments, the dummy gate structure 140 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 144 may include polycrystalline silicon (polysilicon). In some embodiments, the hard mask 146 includes an oxide layer such as a pad oxide layer that may include $SiO_2$, and a nitride layer such as a pad nitride layer that may include Si$_3$N$_4$ and/or silicon oxynitride. In some embodiments, after patterning the dummy gate electrode layer 144, the dummy gate dielectric layer 142 is removed from the S/D regions of the fins FS. The etch process may include a wet etch, a dry etch, and/or a combination thereof. The etch process is chosen to selectively etch the dummy gate dielectric layer 142 without substantially etching the fins FS, the dummy gate electrode layer 144, and the hard mask 146.

After the formation of the dummy gate structures 140, gate spacers 150 are formed on sidewalls of the dummy gate structures 140. For example, a spacer material layer is conformally deposited on the substrate using processes such as, CVD process, a subatmospheric CVD (SACVD) process, a flowable CVD process, an ALD process, a PVD process, or other suitable process. The spacer material layer may include a dielectric material such as silicon oxide, silicon nitride, silicon carbide, silicon oxynitride, SiCN films, silicon oxycarbide, SiOCN films, and/or combinations thereof. The spacer material layer is subsequently etched back to form the gate spacers 150. For example, an anisotropic etching process is performed on the deposited spacer material layer to expose portions of the fins FS not covered by the dummy gate structures 140 (e.g., in source/drain regions of the fins FS). Portions of the spacer material layer directly above the dummy gate structures 140 may be completely removed by this anisotropic etching process. In some embodiments, the spacer material layer includes multiple layers, and therefore the gate spacers 150 may be multi-layer structures.

Reference is made to FIGS. 6A and 6B. Exposed portions of the semiconductor fins FS that extend laterally beyond sidewalls of the gate spacers 150 (e.g., in source/drain regions of the fins FS) are etched by using, for example, an anisotropic etching process that uses the dummy gate structure 140 and the gate spacers 150 as an etch mask, resulting in recesses R1 into the semiconductor fins FS and between corresponding dummy gate lines 140A. After the anisotropic etching, end surfaces of the sacrificial layers 122 and channel layers 124 are aligned with respective outermost sidewalls of the gate spacers 150, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as SF$_6$, CH$_2$F$_2$, CH$_3$F, CHF$_3$, or the like), chloride-based gas (e.g., Cl$_2$), hydrogen bromide gas (HBr), oxygen gas (O$_2$), the like, or combinations thereof.

The, end surfaces of the sacrificial layers 122 are laterally or horizontally recessed by using suitable selective etching process, resulting in lateral recesses R2 each vertically between corresponding channel layers 124. By way of example and not limitation, the sacrificial layers 122 are SiGe and the channel layers 124 are silicon allowing for the selective etching of the sacrificial layers 122. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a SiGeO$_x$ removal. For example, the oxidation may be provided by O$_3$ clean and then SiGeO$_x$ removed by an etchant such as NH$_4$OH that selectively etches SiGeO$_x$ at a faster etch rate than it etches Si. Moreover, because oxidation rate of Si is much lower (sometimes 30 times lower) than oxidation rate of SiGe, the channel layers 324 is not significantly etched by the process of laterally recessing the sacrificial layers 322. As a result, the channel layers 124 laterally extend past opposite end surfaces of the sacrificial layers 122.

Inner spacers 160 are subsequently formed on opposite end surfaces of the laterally recessed sacrificial layers 122. In some embodiments, an inner spacer material layer is formed to fill the recesses R2. The inner spacer material layer may be a low-K dielectric material, such as SiO$_2$, SiN, SiCN, or SiOCN, and may be formed by a suitable deposition method, such as ALD. After the deposition of the inner spacer material layer, an anisotropic etching process may be performed to trim the deposited inner spacer material, such that only portions of the deposited inner spacer material that fill the recesses R2 left by the lateral etching of the sacrificial layers 122 are left. After the trimming process, the remaining portions of the deposited inner spacer material are denoted as inner spacers 160. The inner spacers 160 serve to isolate metal gates from source/drain regions formed in subsequent processing. In the example of FIGS. 6A and 6B, sidewalls of the inner spacers 160 are aligned with sidewalls of the channel layers 124.

In some embodiments, the etching process of forming the recess R1 and R2 may consume oxides of the STI features 130. In absence of the bridge portion 140C, the poly line (e.g., the gate lines 140B) may collapse due to the oxide consume and strong surface tension on the poly lines.

In some embodiments of the present disclosure, by using the bridge portion 140C providing structural support between the gate lines 140B, the stability of the poly lines is improved, thereby avoiding poly collapse.

Figure 7A:
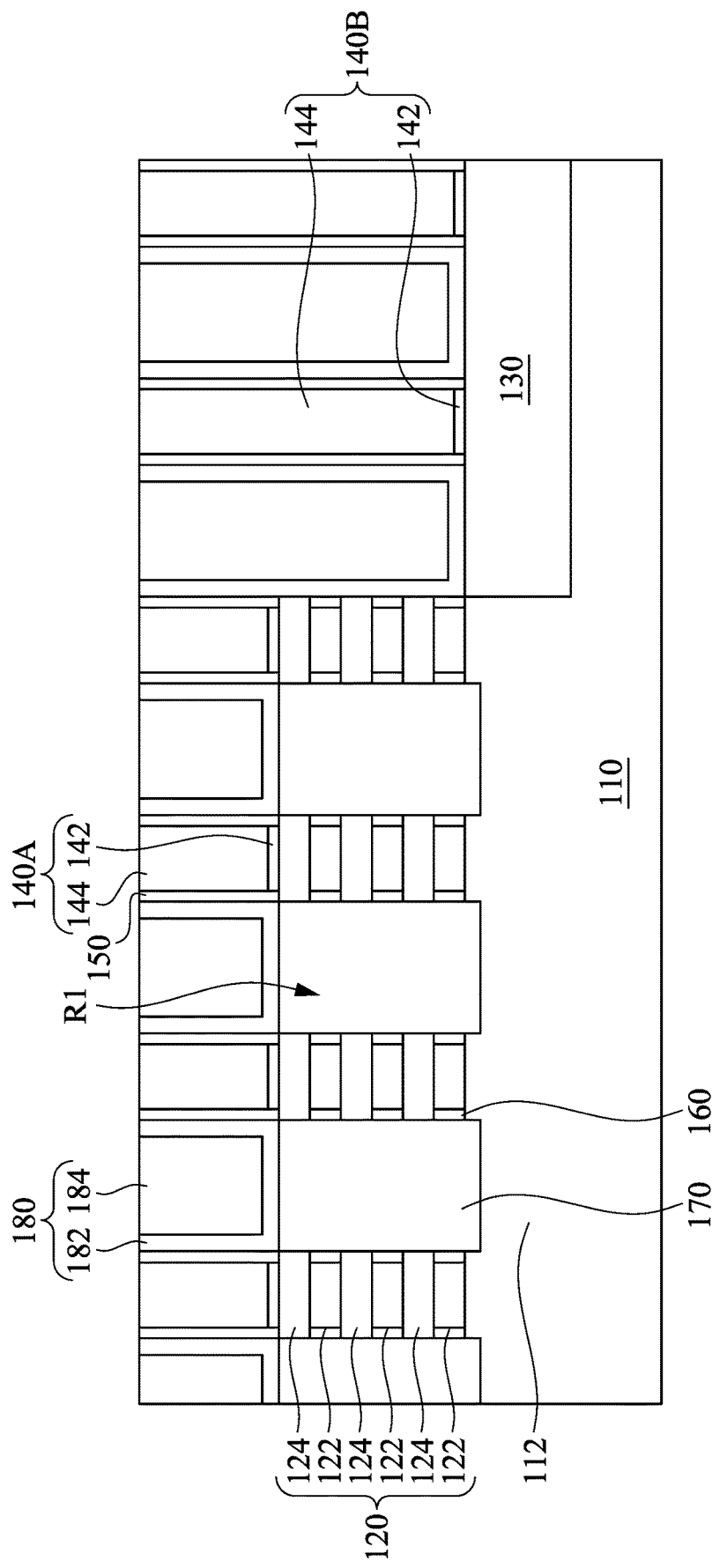
Figure 7B:
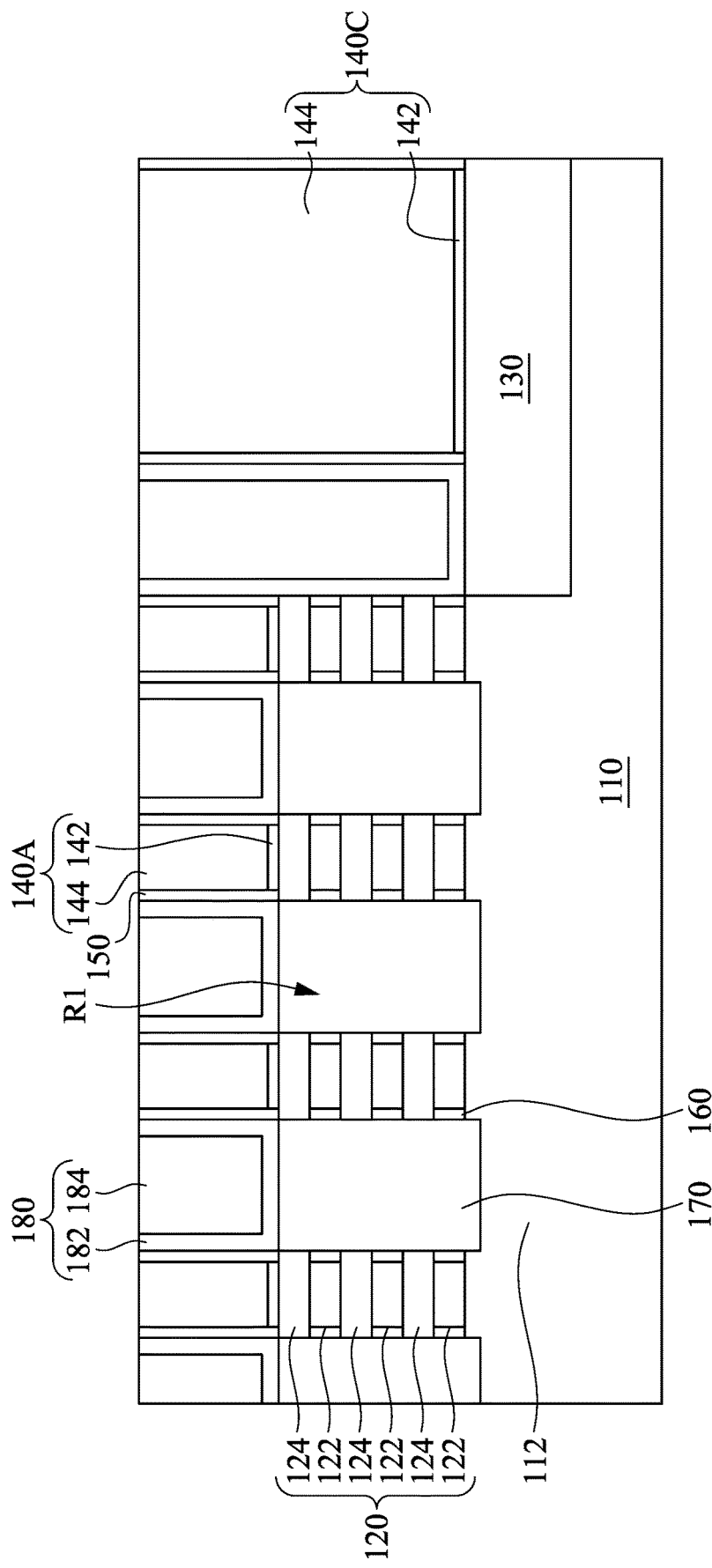
Figure 7C:
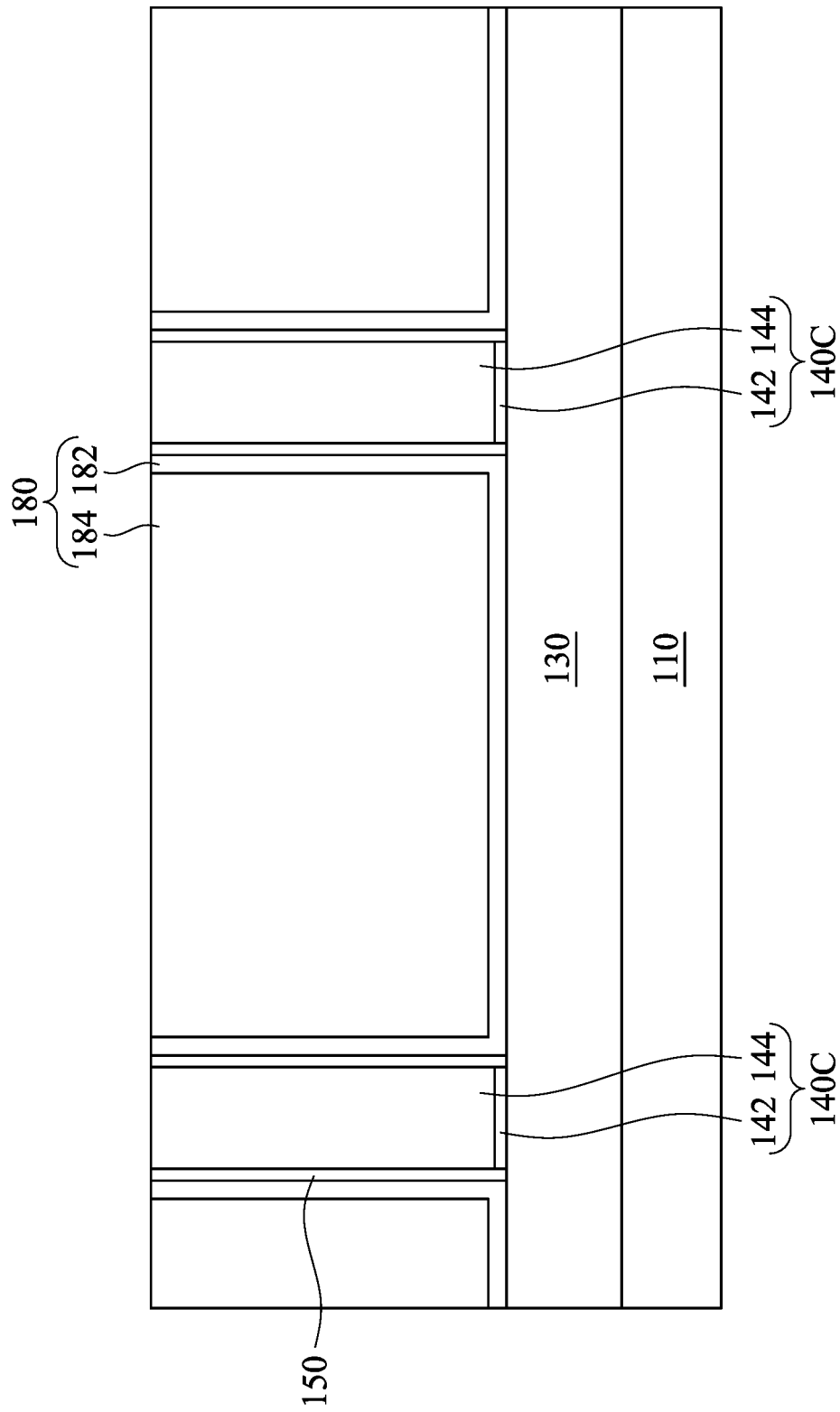
Figure 8A:
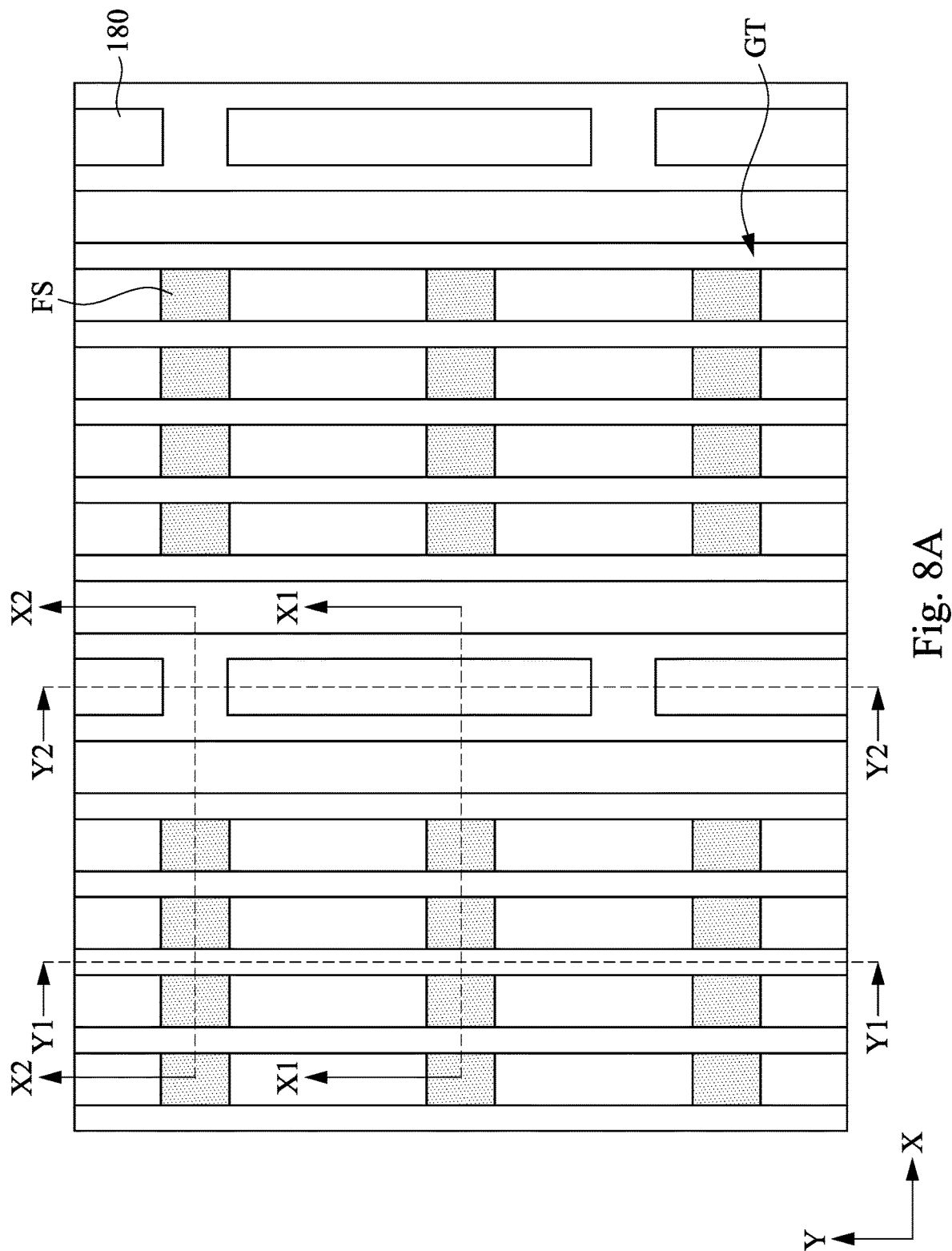
Figure 8B:
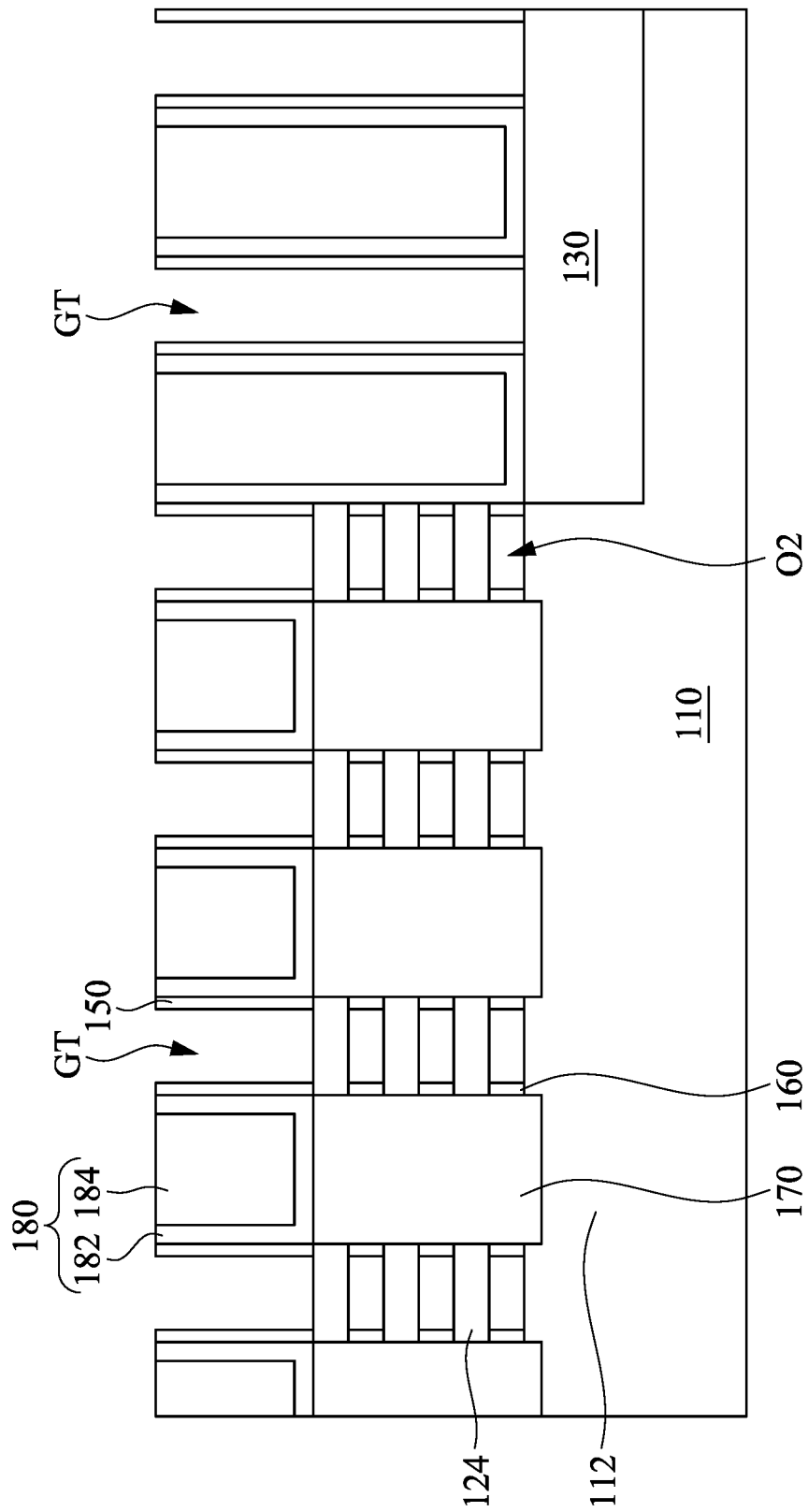
Figure 8C:
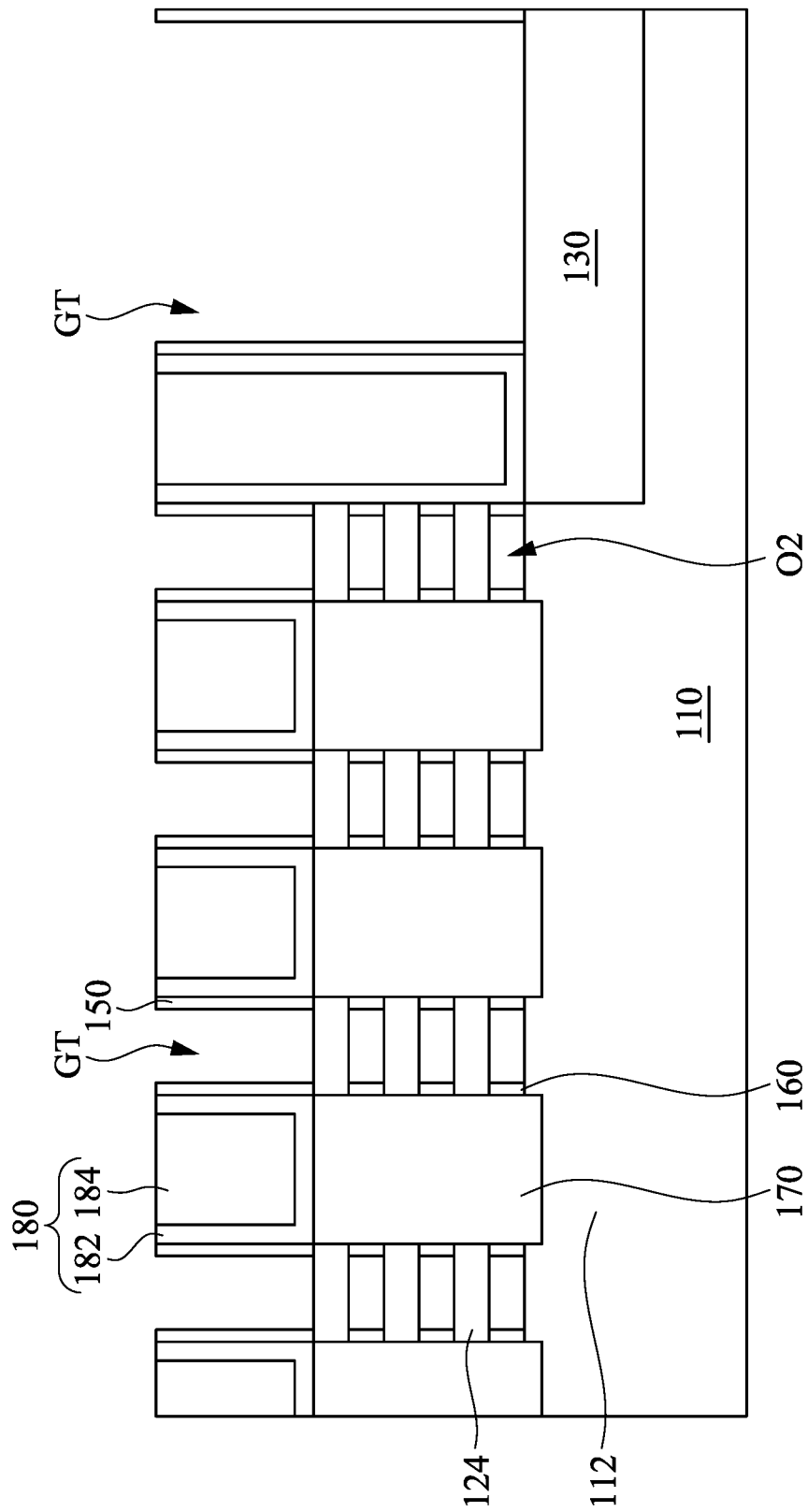
Figure 8D:
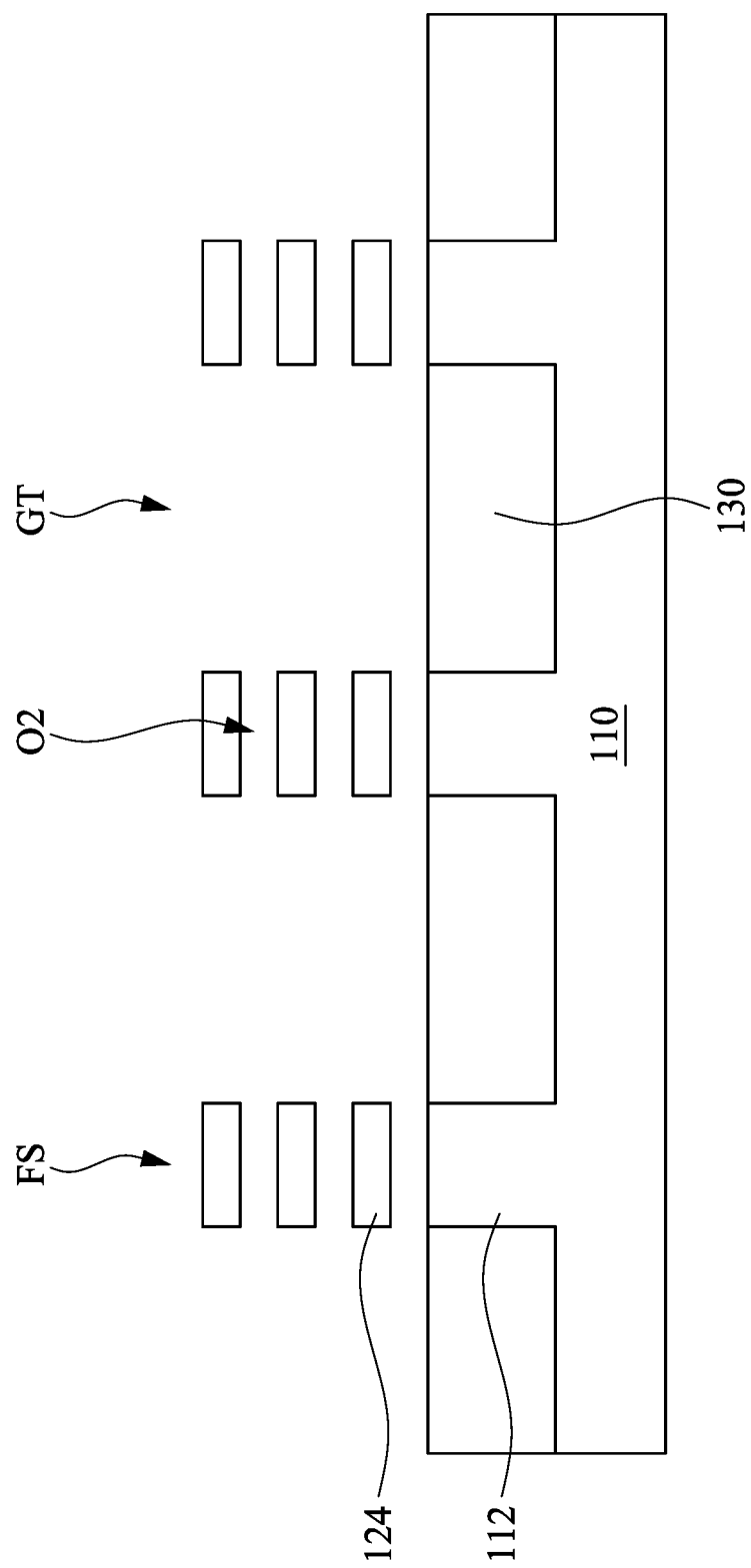
Figure 8E:
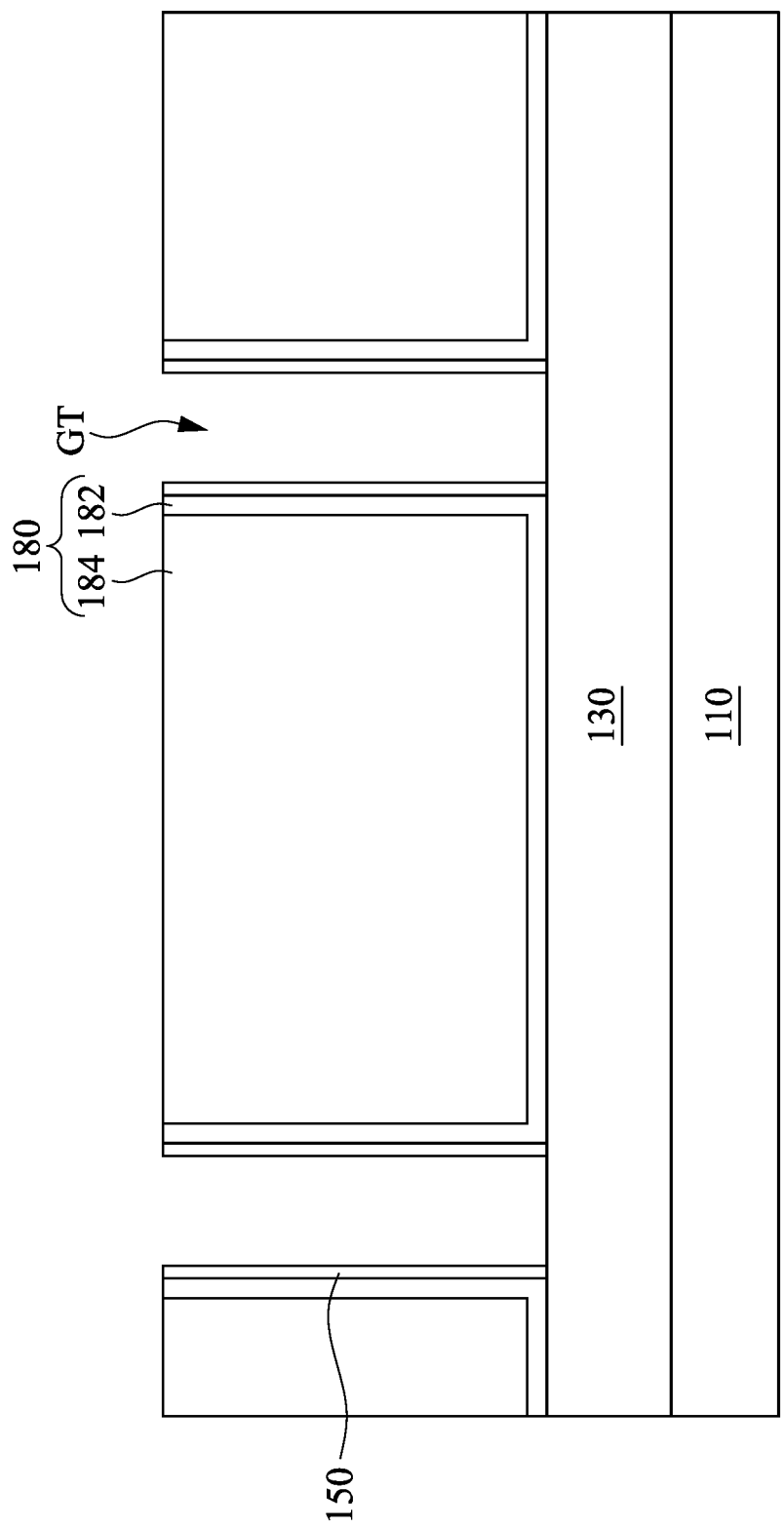
Figure 9A:
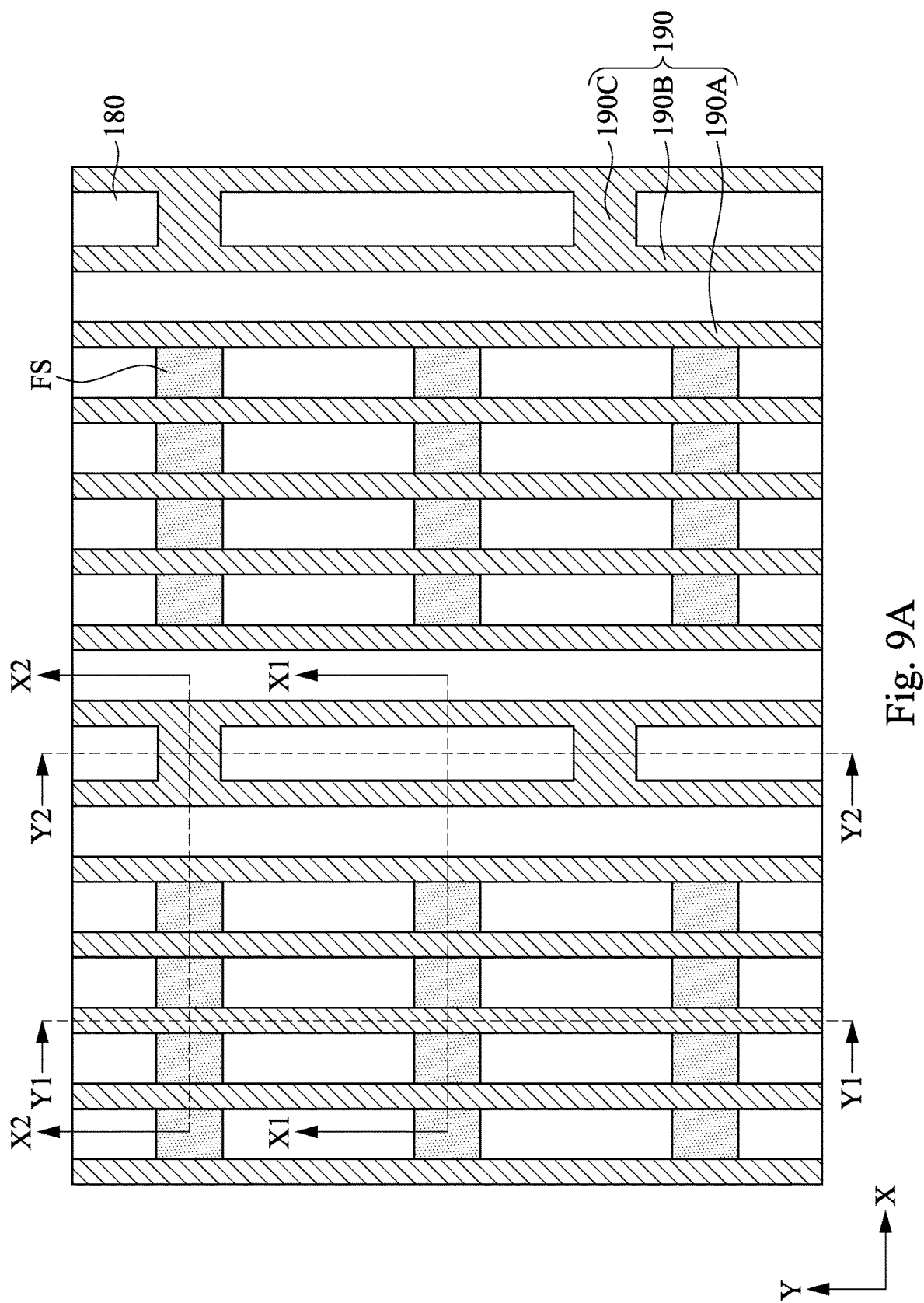
Figure 9B:
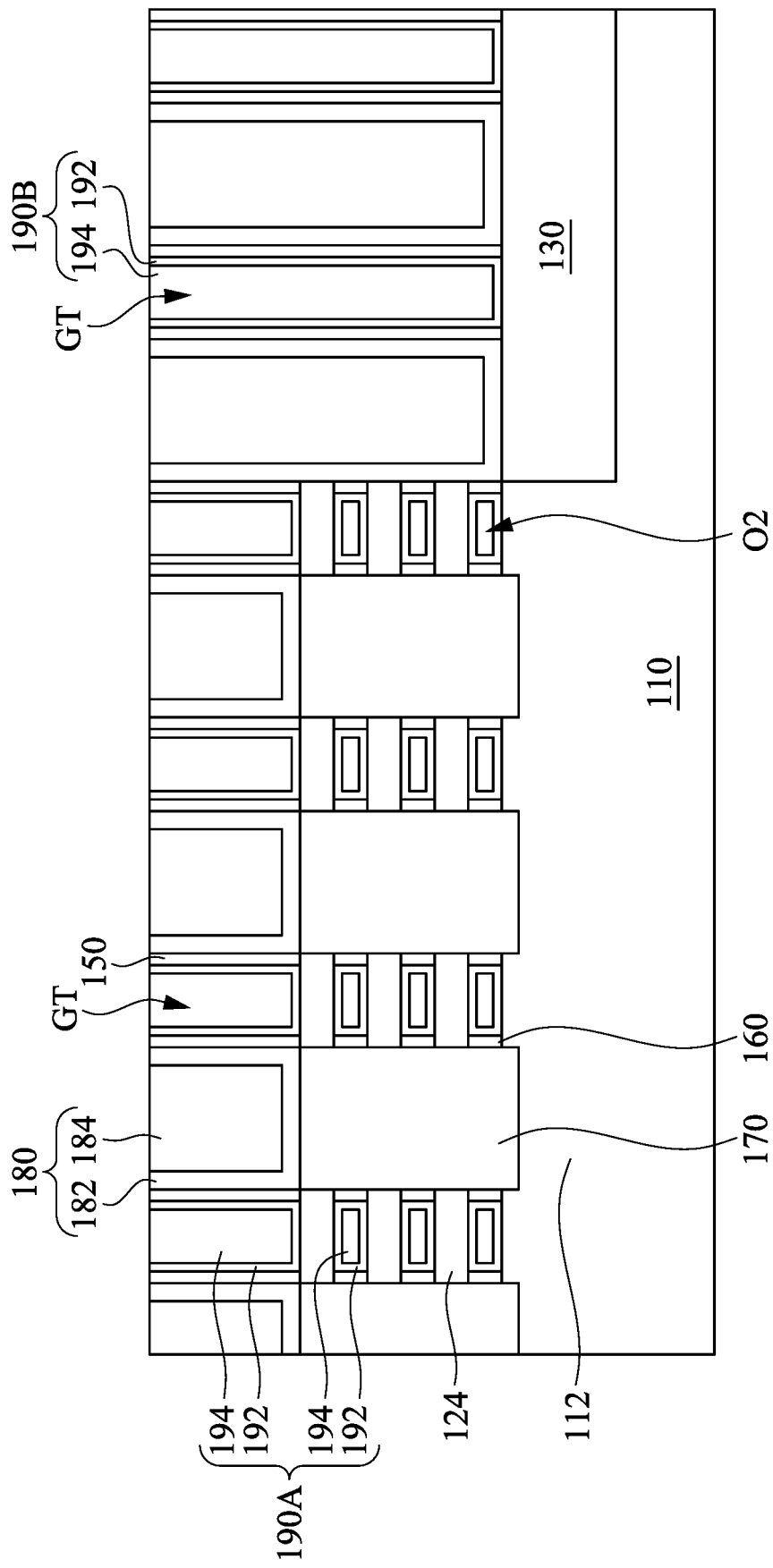
Figure 9C:
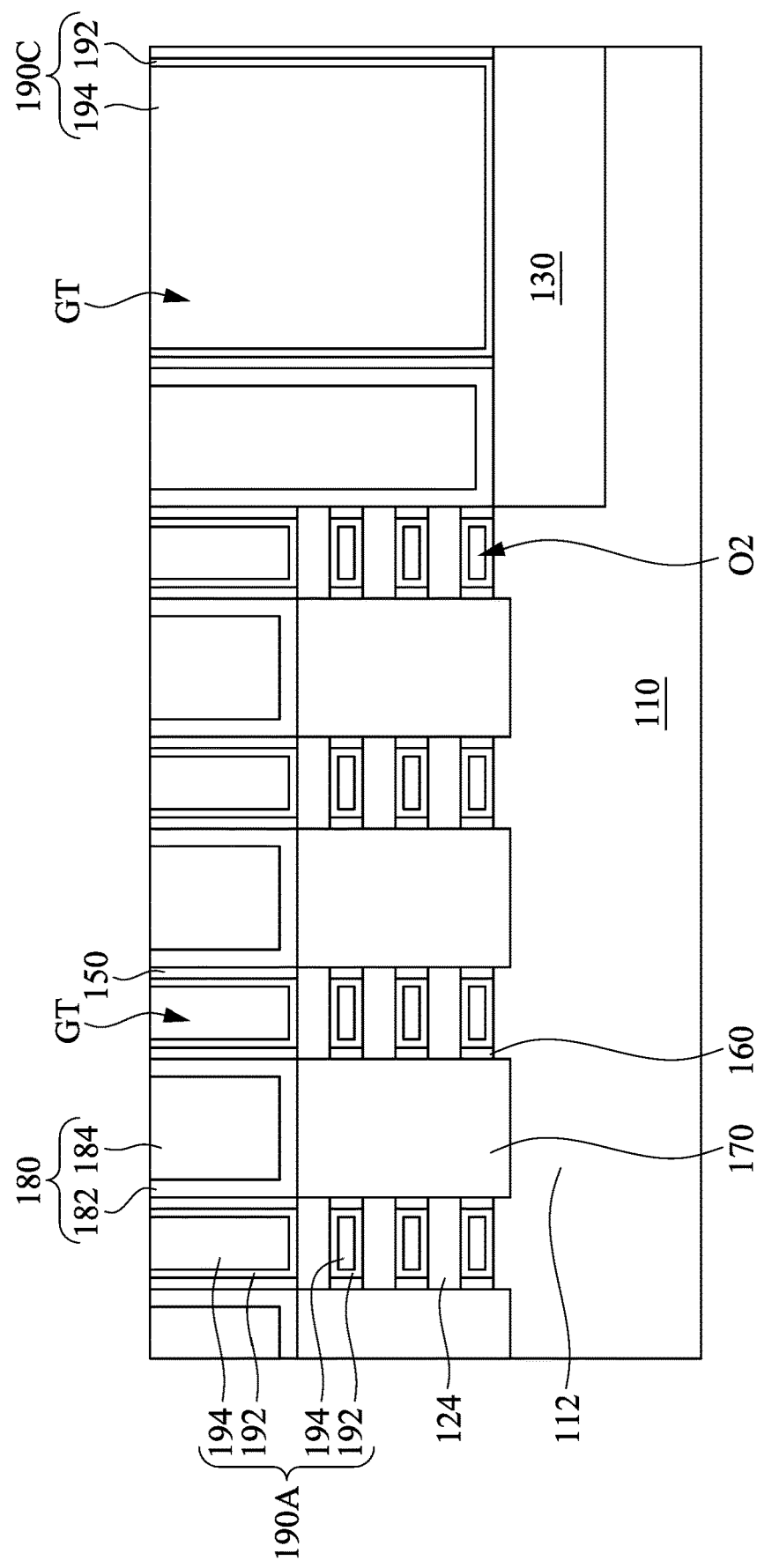
Figure 9E:
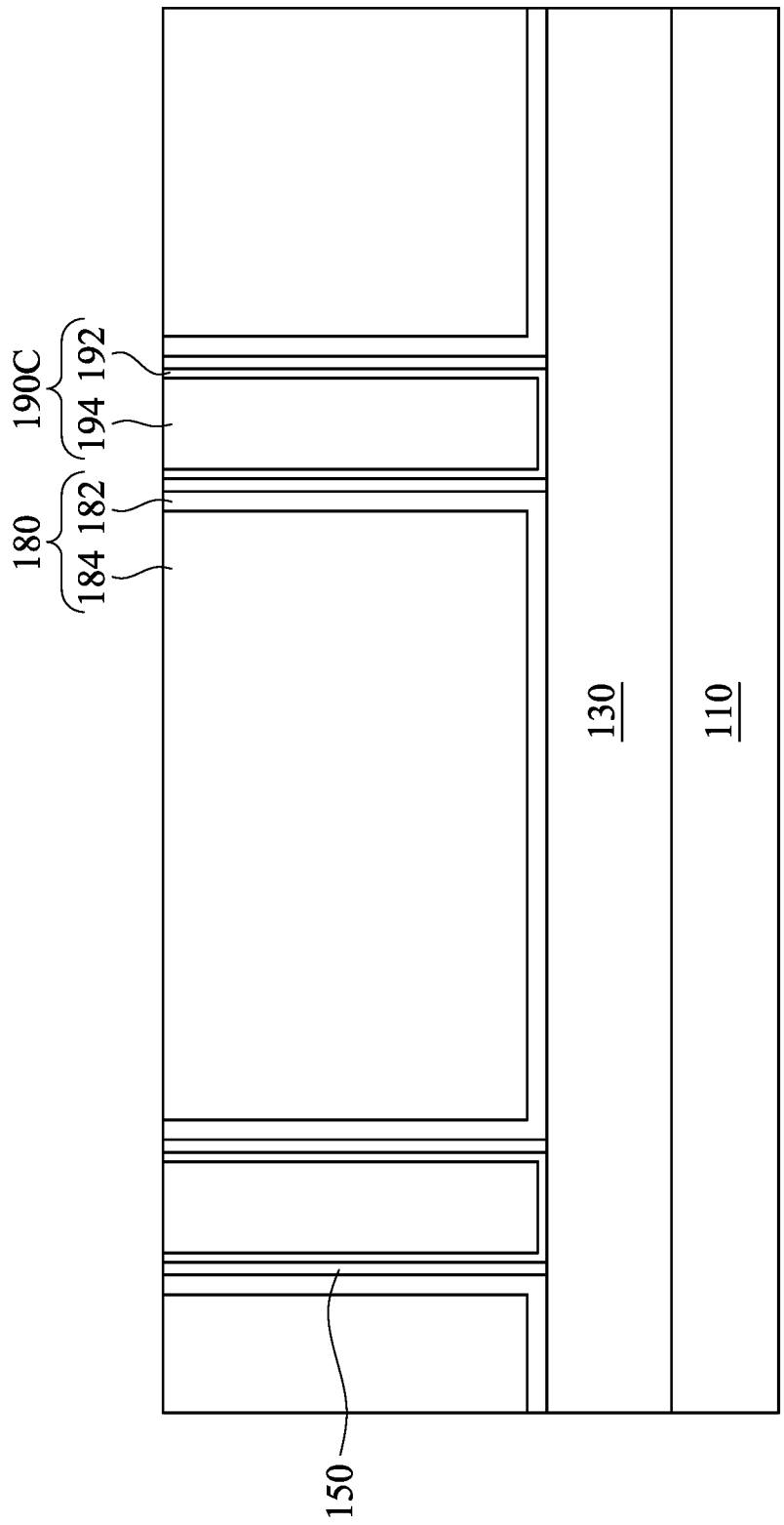

Reference is made to FIGS. 7A, 7B, and 7C. Source/drain epitaxial structures 170 are formed in the recesses R1 in the fins FS. The source/drain epitaxial structures 170 may be formed by performing an epitaxial growth process that provides an epitaxial material on the fins FS. During the epitaxial growth process, the dummy gate structures 140 and gate spacers 150 limit the source/drain epitaxial structures 170 to the source/drain regions. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins FS and the channel layers 124.

In some embodiments, the source/drain epitaxial structures 170 may include Ge, Si, GaAs, AlGaAs, SiGe, GaAsP, SiP, or other suitable material. The source/drain epitaxial structures 290S/290D may be in-situ doped during the epitaxial process by introducing doping species including: p-type dopants, such as boron; n-type dopants, such as phosphorus or arsenic; and/or other suitable dopants including combinations thereof. If the source/drain epitaxial structures 170 are not in-situ doped, an implantation process (i.e., a junction implant process) is performed to dope the source/drain epitaxial structures 170. In some exemplary embodiments, the source/drain epitaxial structures 170 in an NFET device include SiP, while those in a PFET device include GeSnB and/or SiGeSnB.

A dielectric material 180 is formed over the substrate 110 and filling the space between the dummy gate structures 140. In some embodiments, the dielectric material 180 includes a contact etch stop layer (CESL) 182 and an interlayer dielectric (ILD) layer 184 formed in sequence. In some examples, the CESL 182 includes a silicon nitride layer, silicon oxide layer, a silicon oxynitride layer, and/or other suitable materials having a different etch selectivity than the ILD layer 184. The CESL 182 may be formed by plasma-enhanced chemical vapor deposition (PECVD) process and/or other suitable deposition or oxidation processes. The ILD layer 184 is then deposited over the CESL 182. In some embodiments, the ILD layer 184 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 182. The ILD layer 184 may be deposited by a PECVD process or other suitable deposition technique. In some embodiments, after formation of the ILD layer 184, the semiconductor device may be subject to a high thermal budget process to anneal the ILD layer 184.

After depositing the ILD layer 184, a planarization process may be performed to remove excessive materials of the ILD layer 184. For example, a planarization process includes a chemical mechanical planarization (CMP) process which removes portions of the ILD layer 184 and the CESL layer 182 overlying the dummy gate structures 140 and planarizes a top surface of the semiconductor device. In some embodiments, the CMP process also removes the hard mask layer 146 in the dummy gate structures 140 (as shown in FIGS. 6A and 6B) and exposes the dummy gate electrode layer 144.

Reference is made to FIGS. 8A, 8B, 8C, 8D, and 8E. The dummy gate structures 140 (referring to FIGS. 7A, 7B, and 7C) are removed, followed by removing the sacrificial layers 122 (referring to FIGS. 7A and 7B). In the illustrated embodiments, the dummy gate structures 140 (referring to FIGS. 7A, 7B, and 7C) are removed by using a selective etching process (e.g., selective dry etching, selective wet etching, or a combination thereof) that etches the materials in dummy gate structures 140 (referring to FIGS. 7A, 7B, and 7C) at a faster etch rate than it etches other materials (e.g., gate spacers 150, CESL 182, and/or ILD layer 184), thus resulting in gate trenches GT between corresponding gate spacers 150, with the sacrificial layers 122 (referring to FIGS. 7A and 7B) exposed in the gate trenches GT. Subsequently, the sacrificial layers 122 (referring to FIGS. 7A and 7B) in the gate trenches GT are etched by using another selective etching process that etches the sacrificial layers 122 at a faster etch rate than it etches the channel layers 124, thus forming openings/spaces O2 between neighboring channel layers 124. In this way, the channel layers 124 become nanosheets suspended over the substrate 110 and between the source/drain epitaxial structures 170. This step is also called a channel release process. At this interim processing step, the openings O2 between nanosheets 124 may be filled with ambient environment conditions (e.g., air, nitrogen, etc). In some embodiments, the nanosheets 124 can be interchangeably referred to as nanowires, nanoslabs and nanorings, depending on their geometry. For example, in some other embodiments the channel layers 124 may be trimmed to have a substantial rounded shape (i.e., cylindrical) due to the selective etching process for completely removing the sacrificial layers 122 (referring to FIGS. 7A and 7B). In that case, the resultant channel layers 124 can be called nanowires.

In some embodiments, the sacrificial layers 122 (referring to FIGS. 7A and 7B) are removed by using a selective wet etching process. In some embodiments, the sacrificial layers 122 (referring to FIGS. 7A and 7B) are SiGe and the channel layers 124 are silicon allowing for the selective removal of the sacrificial layers 122 (referring to FIGS. 7A and 7B). In some embodiments, the selective wet etching includes an APM etch (e.g., ammonia hydroxide-hydrogen peroxide-water mixture). In some embodiments, the selective removal includes SiGe oxidation followed by a SiGeO$_x$ removal. For example, the oxidation may be provided by O$_3$ clean and then SiGeO$_x$ removed by an etchant such as NH$_4$OH that selectively etches SiGeO$_x$ at a faster etch rate than it etches Si. Moreover, because oxidation rate of Si is much lower (sometimes 30 times lower) than oxidation rate of SiGe, the channel layers 124 may remain substantially intact during the channel release process. In some embodiments, both the channel release step and the previous step of laterally recessing sacrificial layers use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

Reference is made to FIGS. 9A-9E. Replacement gate structures 190 are respectively formed in the gate trenches GT to surround each of the nanosheets 124 suspended in the gate trenches GT. The gate structures 190 may be final gates of GAA FETs. The final gate structure may be a high-k/metal gate stack, however other compositions are possible. In some embodiments, each of the gate structures 190 forms the gate associated with the multi-channels provided by the plurality of nanosheets 124. For example, high-k/metal gate structures 190 are formed within the openings O2 provided by the release of nanosheets 124.

In various embodiments, the high-k/metal gate structure 190 includes a gate dielectric layer 192 formed around the nanosheets 124 and a gate metal layer 194 formed around the dielectric layer 192 and filling a remainder of gate trenches GT. Formation of the high-k/metal gate structures 190 may include one or more deposition processes to form various gate materials, followed by a CMP processes to remove excessive gate materials, resulting in the high-k/metal gate structures 190 having top surfaces level with a top surface of the dielectric material 180. Thus, transistors (e.g., GAA FET) are formed, and the high-k/metal gate structure 190 surrounds each of the nanosheets 124, and thus is referred to as a gate of the transistors (e.g., GAA FET).

The gate dielectric layer 192 may include an interfacial layer and a high-k gate dielectric layer over the interfacial layer. In some embodiments, the interfacial layer is silicon oxide formed on exposed surfaces of semiconductor materials in the gate trenches GT by using, for example, thermal oxidation, chemical oxidation, wet oxidation or the like. As a result, surface portions of the nanosheets 124 and the substrate 110 exposed in the gate trenches GT are oxidized into silicon oxide to form interfacial layer. In some embodiments, the high-k gate dielectric layer includes dielectric materials such as hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide (Ta$_2$O$_5$), yttrium oxide (Y$_2$O$_3$), strontium titanium oxide (SrTiO$_3$, STO), barium titanium oxide (BaTiO$_3$, BTO), barium zirconium oxide (BaZrO), hafnium lanthanum oxide (HfLaO), lanthanum silicon oxide (LaSiO), aluminum silicon oxide (AlSiO), aluminum oxide (Al$_2$O$_3$), the like, or combinations thereof.

In some embodiments, the gate metal layer 194 includes one or more metal layers. For example, the gate metal layer 194 may include one or more work function metal layers stacked one over another and a fill metal filling up a remainder of gate trenches GT. The one or more work function metal layers in the gate metal layer 194 provide a suitable work function for the high-k/metal gate structures 310. For an n-type GAA FET, the gate metal layer 194 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the gate metal layer 194 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 194 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

The high-k/metal gate structures 190 may include gate lines 190A and 190B and bridge portions 190C, respectively corresponding to the dummy (or sacrificial) gate lines 140A and 140B and bridge portions 140C in FIGS. 5A, 5B, 5C, 5D, and 5E. In some embodiments, the gate lines 190A are active gates, which form active transistors with the nanosheets 124 and the source/drain epitaxial structures 170. On the other hand, the gate lines 190B and the bridge portions 190C are inactive (or non-operative) floating gates. In some embodiments, a combination of the gate lines 190B and the bridge portions 190C, which are connected to each other, may be referred to as a dummy, inactive, or non-operative, high-k/metal gate structure. The gate lines 190A and 190B and bridge portions 190C have substantially the same configuration of the dummy (or sacrificial) gate lines 140A and 140B and bridge portions 140C in FIGS. 5A, 5B, 5C, 5D, and 5E. For example, the bridge portions 190C extending from a sidewall of at least one gate lines 190B and connecting the gate lines 190B to each other along a direction X perpendicular to the direction Y. The bridge portions 190C may extend through plural gate lines 140B from the top view of FIG. 9A. Through the configuration, the bridge portions 190C provide structural support between the gate lines 190B. In some embodiments, a combination of the gate lines 190B and the bridge portions 190C, which are connected to each other, may be referred to as an inactive or non-operative gate structure. In some embodiments, the inactive or non-operative gate structures (e.g., the gate lines 190B and the bridge portions 190C) are not in contact/connection with the gate lines 190A and spaced apart from the active region of the semiconductor substrate 110 (e.g., fins FS). For example, an entirety of a bottom surface of an inactive or non-operative gate structure (e.g., the gate lines 190B and the bridge portions 190C) is in contact with the STI feature 130. The pattern, widths, lengths, and pitches of the gate lines 190A and 190B and bridge portions 190C are similar to that of the dummy (or sacrificial) gate lines 140A and 140B and bridge portions 140C in FIGS. 5A, 5B, 5C, 5D, and 5E, and thereto not repeated herein.

Figure 10:
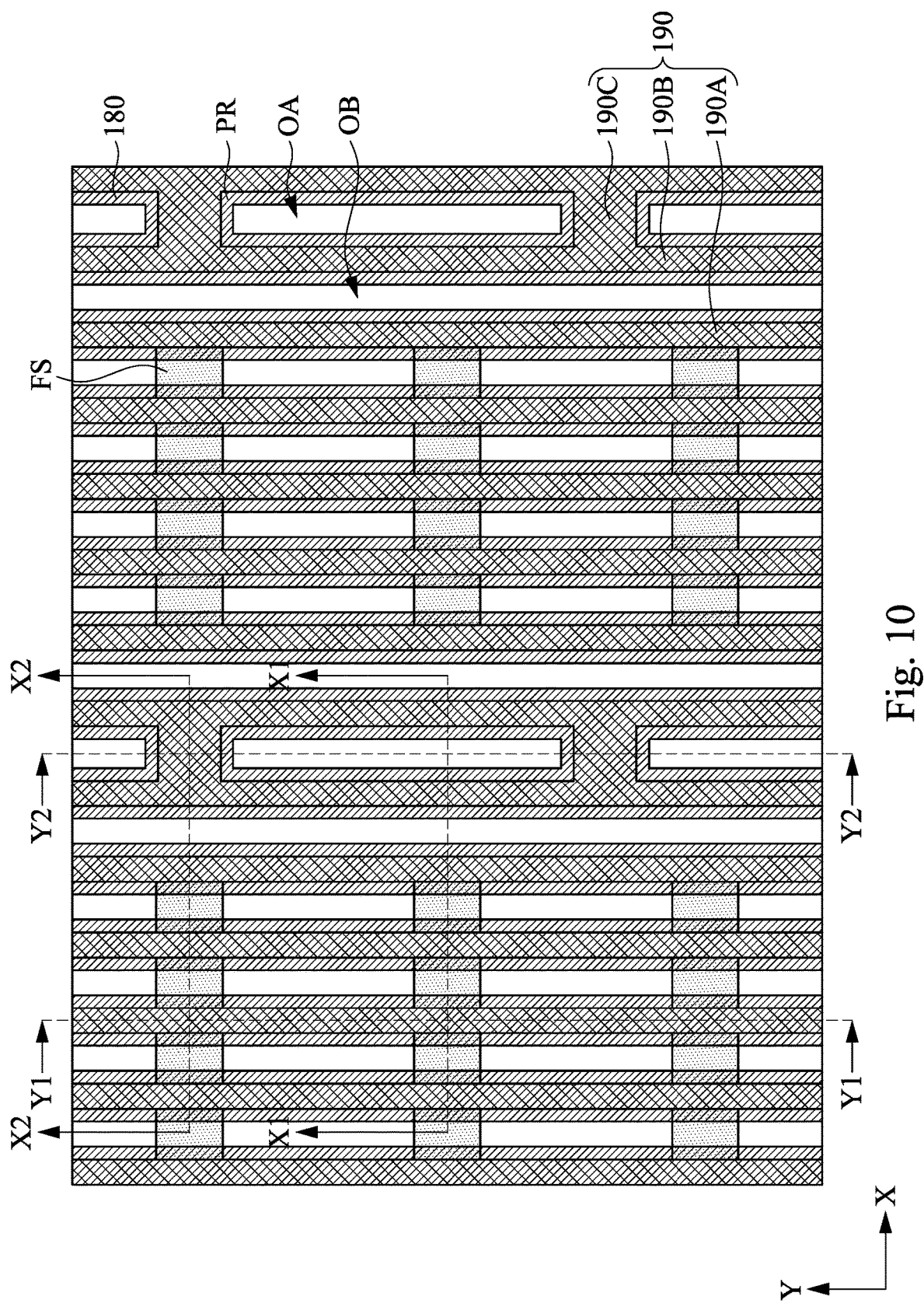
Figure 11A:
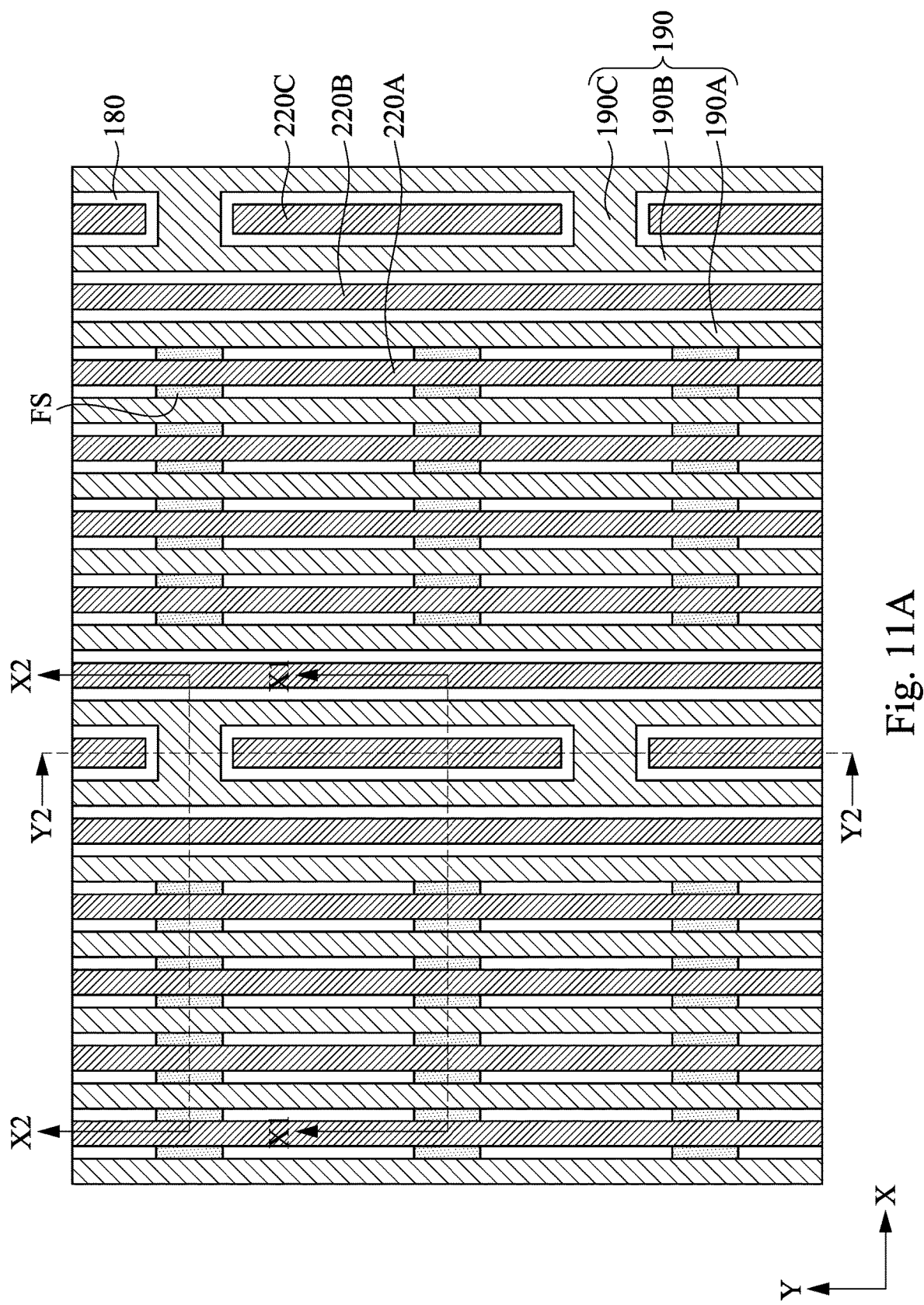
Figure 11B:
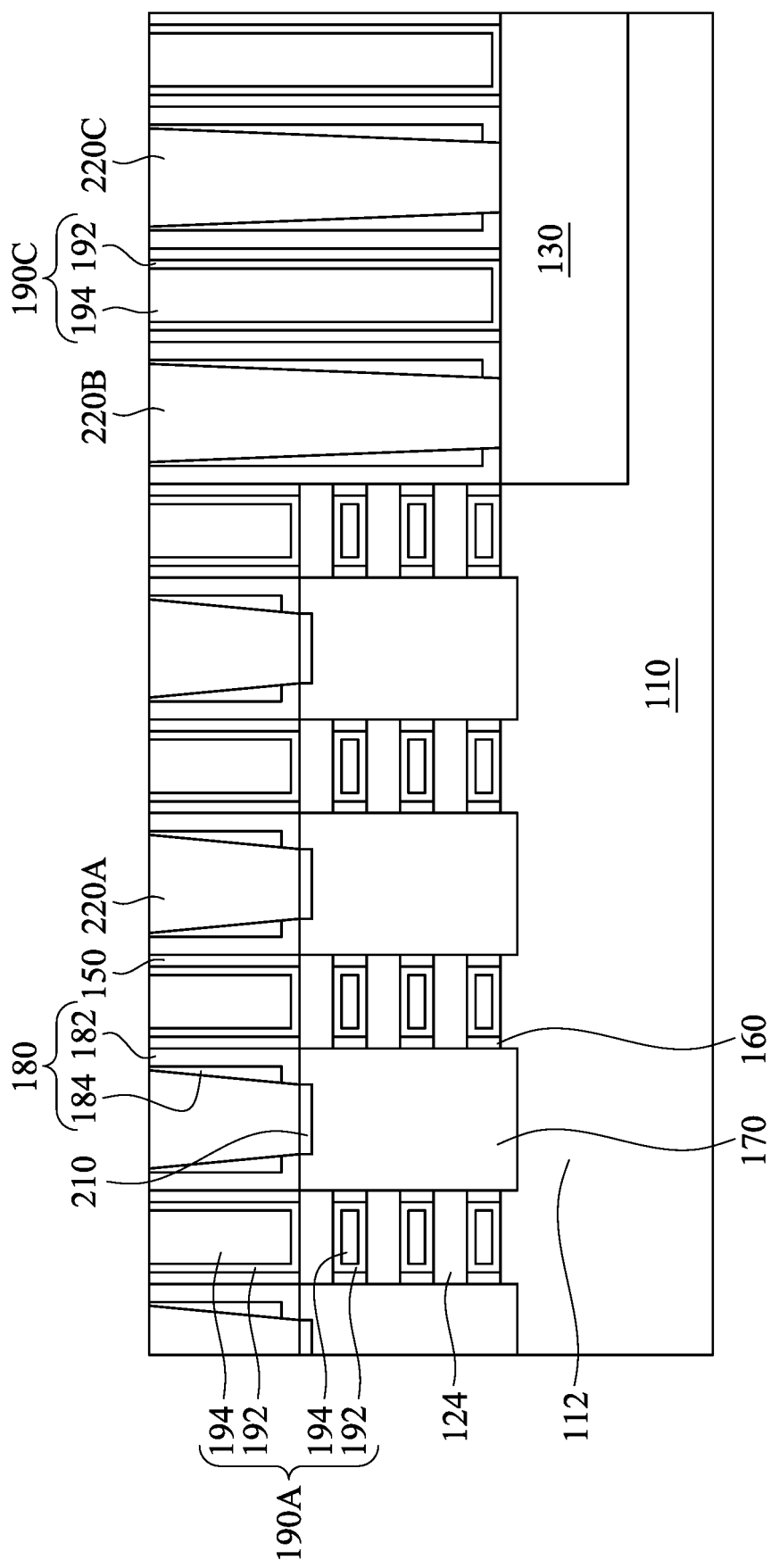
Figure 11C:
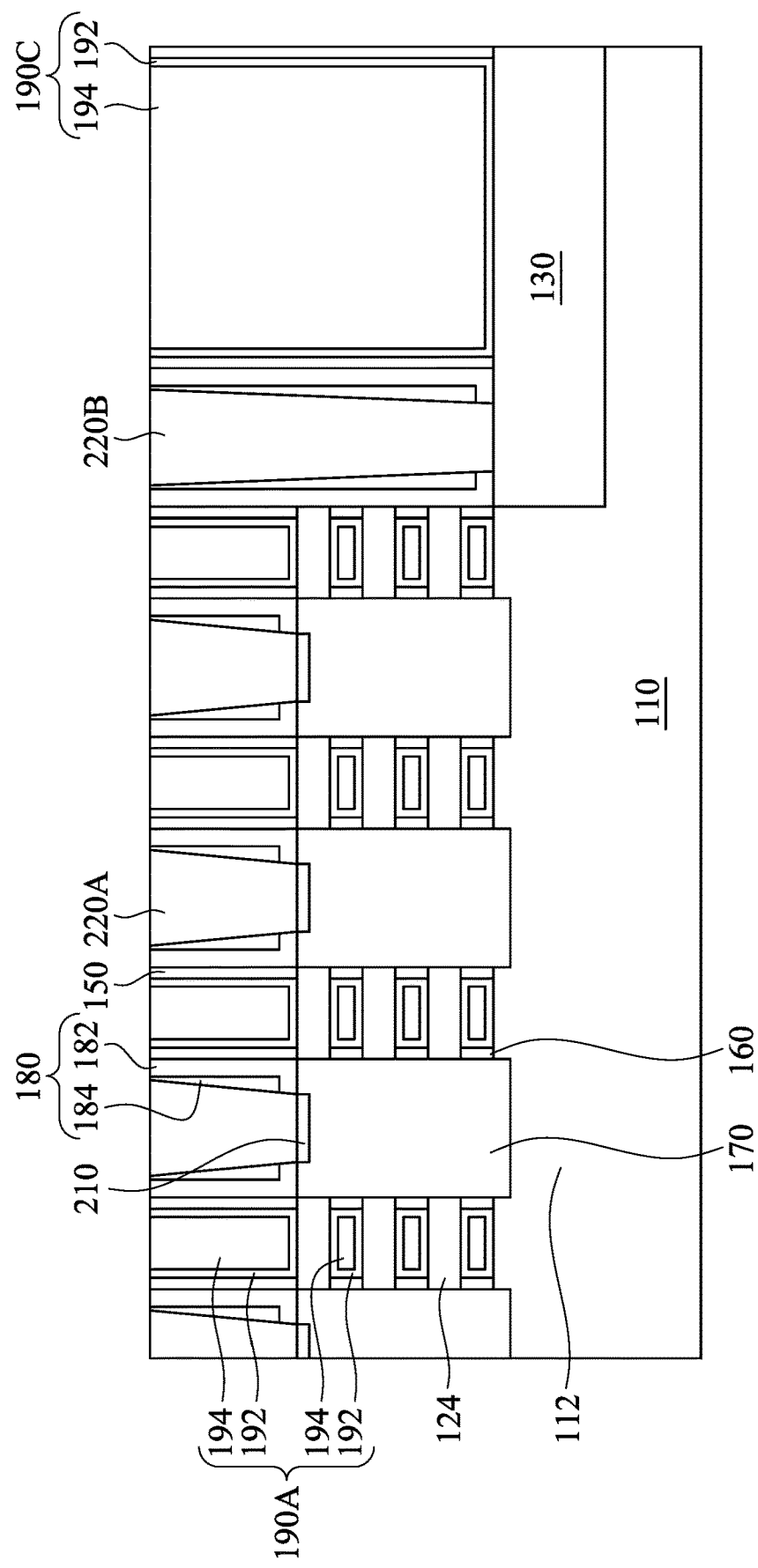
Figure 11D:
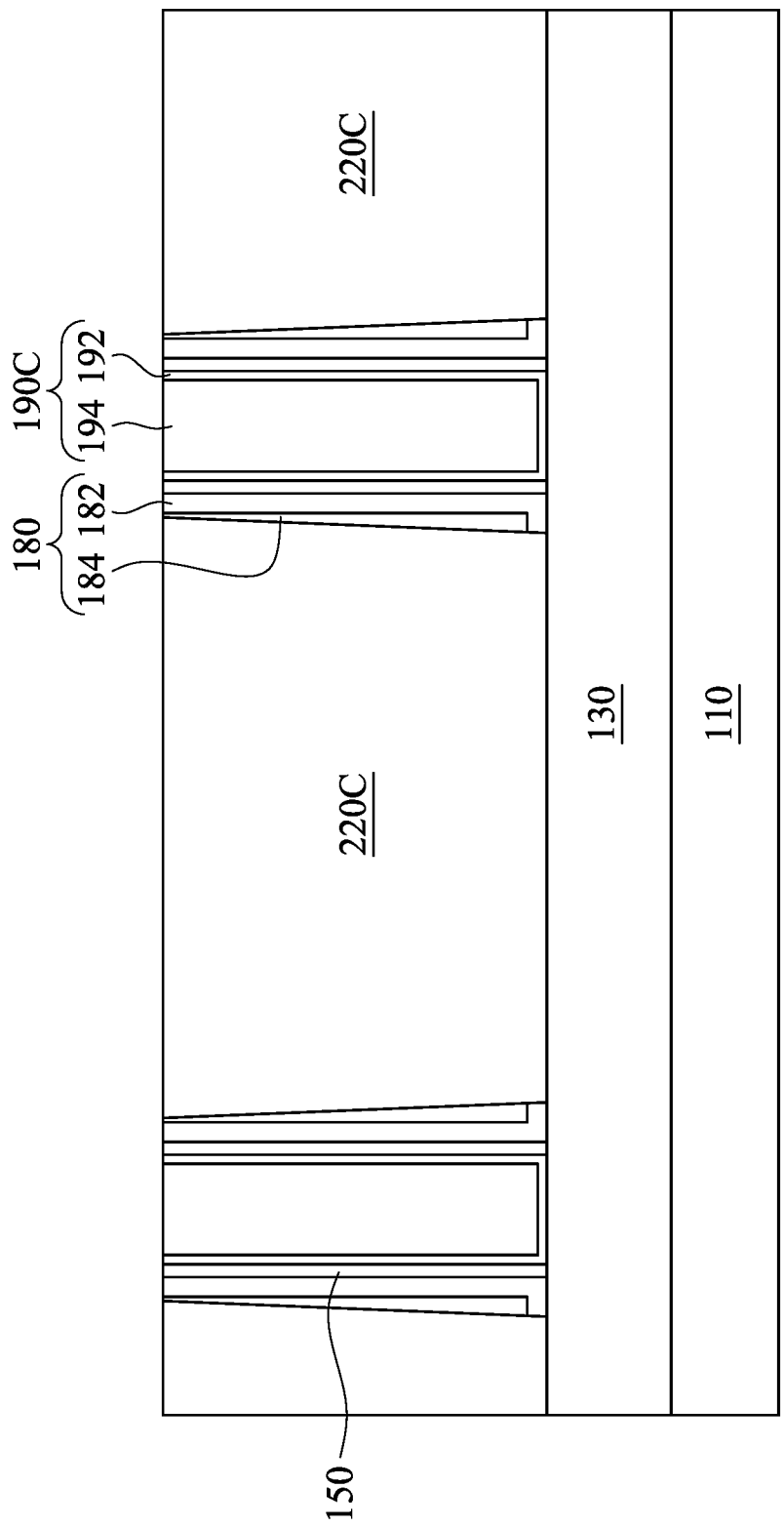

Reference is made to FIG. 10. A photoresist layer PR is formed over the structure of FIGS. 9A, 9B, 9C, 9D, and 9E. The photoresist layer PR may include suitable photosensitive organic materials. The photoresist layer PR is patterned by suitable photolithography process to have openings OA and OB, which respectively define source/drain contacts 220A and conductive features 220B in FIGS. 11A, 11B, 11C, and 11D. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof.

Reference is made to FIGS. 11A, 11B, 11C, and 11D. Source/drain contacts 220A are formed over the source/drain epitaxial structure 170. In some embodiments, the source/drain contact formation step includes etching source/drain contact openings through the dielectric material 180 to expose the source/drain epitaxial structures 170 and depositing one or more metal materials to fill the source/drain contact openings. The metal materials may include W, Ru, Co, Cu, Ti, TiN, Ta, TaN, Mo, Ni, the like or combinations thereof. The metal materials may be deposited by using suitable deposition techniques (e.g., CVD, PVD, ALD, the like or combinations thereof). After the metal deposition, a CMP process is performed to remove excess metal materials outside the source/drain contact openings, while leaving metal materials in the source/drain contact openings to serve as the source/drain contacts 220A. In some embodiments, prior to the metal deposition, metal silicide regions 210 are formed on exposed surfaces of the source/drain epitaxial structures 170 by using a silicidation process. Silicidation may be formed by blanket depositing a metal layer over the exposed source/drain epitaxial structures 170, annealing the metal layer such that the metal layer reacts with silicon (and germanium if present) in the source/drain epitaxial structures 170 to form the metal silicide regions 210, and thereafter removing the non-reacted metal layer. In some embodiments, the metal layer used in the silicidation process includes nickel, cobalt, titanium, tantalum, platinum, tungsten, other noble metals, other refractory metals, rare earth metals or their alloys.

In some embodiments of the present disclosure, conductive features 220B and 220C may be formed on the STI features 130. The conductive features 220B and 220C and the source/drain contacts 220A may be formed by the same source/drain contact formation step. The conductive features 220B and 220C and the source/drain contacts 220A may include the same metal materials. The conductive features 220B and 220C may not be electrically connected with source/drain epitaxial structures 170. For example, the conductive features 220B and 220C may be electrically floating. In some embodiments, the source/drain contacts 220A can be referred to as active/operative conductive features, the conductive features 220B and 220C can be referred to as inactive/non-operative conductive features. The conductive features 220B may be located between the active gate lines 190A and the inactive gate lines 190B. Each of the conductive features 220C may be between two adjacent gate lines 190B and between two adjacent bridge portions 190C.

FIG. 12A is a schematic top view of a semiconductor device in accordance with some embodiments of the present disclosure. FIG. 12B is a cross-sectional view taken along line X1-X1 in FIG. 11A. FIG. 12C is a cross-sectional view taken along line X2-X2 in FIG. 11A. Details of the present embodiments are similar to the embodiments of FIGS. 1, 2A, 2B, 3A, 3B, 4A, 4B, 4C, 5A, 5B, 5C, 5D, 5E, 6A, 6B, 7A, 7B, 7C, 8A, 8B, 8C, 8D, 8E, 9A, 9B, 9C, 9D, 9E, 10, 11A, 11B, 11C, and 11D, except that the bridge portions 140C connects three gate lines 140B to each other. For example, the width $C_{xw}$ of the bridge portions 140C may be equal to a sum of twice the line pitch $G_p$ and the line width $G_w$, or approximately twice the line pitch Gp. Other details of the present embodiments are similar to those illustrated previously, and thereto not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that horizontal poly lines are inserted between vertical poly lines, thereby provide horizontal structural support to the vertical poly lines, and preventing poly lines from collapse. Another advantage is that defects due to poly line collapse is reduced. Still another advance is that while some wet chemicals may consume the oxide and provide strong surface tension on the poly lines, the insertion of the horizontal poly lines can relax the the process window.

According to some embodiments of the present disclosure, a semiconductor device includes a semiconductor substrate, an isolation feature, gate lines, and a first gate structure. The isolation feature is over the semiconductor substrate and surrounding an active region of the semiconductor substrate. The gate lines extend across the active region of the semiconductor substrate. The first gate structure is over the isolation feature from a cross-sectional view. From a top view, the first gate structure includes a first gate line, a second gate line, and a first bridge portion. From a top view the first and second gate lines are substantially parallel with the gate lines, and the first bridge portion connects the first gate line to the second gate line.

According to some embodiments of the present disclosure, the semiconductor device includes a semiconductor substrate; and a first gate structure over the semiconductor substrate. The first gate structure includes at least one gate line and at least one bridge portion, the at least one gate line extends along a gate direction, and the at least one bridge portion extends from a sidewall of the at least one gate line along a direction perpendicular to the gate direction from a top view.

According to some embodiments of the present disclosure, a method for fabricating a semiconductor device is provided. The method includes forming an isolation structure over a semiconductor substrate, wherein the isolation structure surrounds an active region of the semiconductor substrate; and forming a gate line across the active region of the semiconductor substrate and a gate structure over the isolation structure, wherein the gate structure includes a first gate line, a second gate line, and a bridge portion connecting the first gate line to the second gate line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   an isolation feature over the semiconductor substrate and surrounding an active region of the semiconductor substrate, wherein the active region extends in a first direction from a top view;
   a plurality of gate lines extending across the active region of the semiconductor substrate;
   a first gate structure over the isolation feature from a cross-sectional view, wherein from the top view the first gate structure comprises a first gate line, a second gate line, and a first bridge portion, the first and second gate lines are substantially parallel with the gate lines, and the first bridge portion connects the first gate line to the second gate line; and
   a second gate structure over the isolation feature, wherein the active region is between the first and second gate structures in the first direction from the top view, and the second gate structure comprises a first gate line, a second gate line, and a bridge portion connecting the first gate line of the second gate structure to the second gate line of the second gate structure.

2. The semiconductor device of claim 1, wherein the first gate structure further comprises a third gate line substantially parallel with the first and second gate lines, and the first bridge portion connects the third gate line to the first and second gate lines.

3. The semiconductor device of claim 1, wherein the first gate structure further comprises a second bridge portion connecting the first gate line to the second gate line.

4. The semiconductor device of claim 3, further comprising:
   a conductive feature between the first and second bridge portions of the first gate structure.

5. The semiconductor device of claim 1, further comprising:
   a conductive feature between the first and second gate lines of the first gate structure.

6. The semiconductor device of claim 1, wherein a width of the gate lines is substantially equal to a width of the first gate line.

7. The semiconductor device of claim 1, wherein a width of the first bridge portion is greater than a width of the first gate line.

8. The semiconductor device of claim 1, wherein the first gate structure is spaced apart from the active region of the semiconductor substrate.

9. The semiconductor device of claim 1, wherein:
   center-to-center pitch between the first and second gate structures is greater than 6 times a pitch between the gate lines.

10. The semiconductor device of claim 1, wherein the first bridge portion is aligned with the active region of the semiconductor substrate from the top view.

11. The semiconductor device of claim 1, wherein the first bridge portion is misaligned with the active region of the semiconductor substrate from the top view.

12. A semiconductor device, comprising:
    a semiconductor substrate; and
    a first gate structure over the semiconductor substrate, wherein the first gate structure comprises a first gate line, a second gate line, a first bridge portion, and a second bridge portion, the first gate line extends along a gate direction, the first bridge portion and the second bridge portion extend from a sidewall of the first gate line along a direction perpendicular to the gate direction from a top view, and a portion of the first gate line between the first bridge portion and the second bridge portion is spaced apart from the second gate line.

13. The semiconductor device of claim 12, wherein the first bridge portion extends through the second gate line from the top view.

14. The semiconductor device of claim 12, wherein a width of the first bridge portion measured along the gate direction is greater than a width of the first gate line measured along the direction perpendicular to the gate direction from the top view.

15. The semiconductor device of claim 12, further comprising:
   a first active region over the semiconductor substrate; and
   a second active region over the semiconductor substrate and adjacent the first active region, wherein the first active region and the second active region extend along the direction perpendicular to the gate direction from the top view, and a distance between the first bridge portion and the second bridge portion in the gate direction is greater than a distance between the first active region and the second active region in the gate direction.

16. A method for fabricating a semiconductor device, comprising:
   forming an isolation structure over a semiconductor substrate, wherein the isolation structure surrounds an active region of the semiconductor substrate;
   forming a gate line across the active region of the semiconductor substrate and a gate structure over the isolation structure, wherein the gate structure comprises a first gate line, a second gate line, and a bridge portion connecting the first gate line to the second gate line;
   forming a gate spacer over the isolation structure; and
   forming a conductive feature over the isolation structure and between the first gate line and the second gate line, wherein the conductive feature is spaced apart from the bridge portion by the gate spacer from a top view.

17. The method of claim 16, wherein forming the gate line and the gate structure is performed such that an entirety of a bottom surface of the gate structure is in contact with the isolation structure.

18. The method of claim 16, wherein forming the gate line and the gate structure is performed such that the gate line, the first gate line, the second gate line have substantially the same width.

19. The method of claim 16, wherein forming the gate line and the gate structure is performed such that the gate line, the first gate line, the second gate line have substantially the same pitch therebetween.

20. The method of claim 16, wherein a width of the conductive feature is less than a distance between the first gate line and the second gate line.

* * * * *